United States Patent
Broadbent et al.

(10) Patent No.: US 11,455,021 B2
(45) Date of Patent: Sep. 27, 2022

(54) DATACENTER POWER MANAGEMENT USING AC AND DC POWER SOURCES

(71) Applicant: Virtual Power Systems, Inc., Milpitas, CA (US)

(72) Inventors: Craig Broadbent, Lake Geneva, WI (US); Nikhil Sharma, El Dorado Hills, CA (US); Karimulla Raja Shaikh, Cupertino, CA (US); Shankar Ramamurthy, Saratoga, CA (US)

(73) Assignee: Cato, Milpitas, CA (US)

( * ) Notice: Subject to any disclaimer, the term of this patent is extended or adjusted under 35 U.S.C. 154(b) by 0 days.

(21) Appl. No.: 15/843,702

(22) Filed: Dec. 15, 2017

(65) Prior Publication Data

US 2018/0116070 A1    Apr. 26, 2018

Related U.S. Application Data

(63) Continuation-in-part of application No. 15/680,286, filed on Aug. 18, 2017, now Pat. No. 11,314,304.

(Continued)

(51) Int. Cl.
*H05K 7/14* (2006.01)
*H02J 9/06* (2006.01)
(Continued)

(52) U.S. Cl.
CPC ............. *G06F 1/3206* (2013.01); *G06F 1/189* (2013.01); *G06F 1/263* (2013.01); *G06F 1/30* (2013.01);
(Continued)

(58) Field of Classification Search
CPC ........ H05K 7/1492; H02J 4/00; H02J 9/061; H02J 9/062; H02J 7/34; H02J 7/35;
(Continued)

(56) References Cited

U.S. PATENT DOCUMENTS 6,396,170 B1    5/2002    Laufenberg et al.
6,967,283 B2    11/2005   Rasmussen et al.
(Continued)

FOREIGN PATENT DOCUMENTS

EP    2372861 B1    10/2011
JP    2009232521 A   10/2009
(Continued)

OTHER PUBLICATIONS

Metcalf, Jeffrey, "Power Efficiency Comparison: Cisco UCS® 5108 Blade Server Chassis and HP BladeSystem® c7000 Enclosure", Copyright Sep. 2013, Cisco.

(Continued)

*Primary Examiner* — M. N. Von Buhr

(57) ABSTRACT

In disclosed techniques, datacenter power management uses AC and DC power sources. An AC power distribution topology within a datacenter provides one or more AC power sources to computing devices. A DC power distribution topology within the datacenter provides one or more DC power sources to computing devices. An uninterruptible power supply (UPS) is provisioned to a rack of computing devices, wherein the UPS is capable of receiving the one or more AC power sources using the AC power distribution topology and the one or more DC power sources using the DC power distribution topology. The one or more DC power sources are evaluated for energizing the DC power distribution topology. The one or more DC power sources are connected to the UPS which is provisioned to the rack of computing devices, based on the evaluating and a datacenter power requirement.

32 Claims, 10 Drawing Sheets

Related U.S. Application Data

(60) Provisional application No. 62/550,009, filed on Aug. 25, 2017, provisional application No. 62/527,091, filed on Jun. 30, 2017, provisional application No. 62/523,732, filed on Jun. 22, 2017, provisional application No. 62/511,130, filed on May 25, 2017, provisional application No. 62/480,386, filed on Apr. 1, 2017, provisional application No. 62/376,881, filed on Aug. 18, 2016.

(51) Int. Cl.
| | |
|---|---|
| G06F 1/18 | (2006.01) |
| G06F 1/26 | (2006.01) |
| G06F 1/30 | (2006.01) |
| G06F 1/3206 | (2019.01) |
| H02J 4/00 | (2006.01) |
| H02J 7/35 | (2006.01) |
| H02J 7/34 | (2006.01) |

(52) U.S. Cl.
CPC .............. *H02J 4/00* (2013.01); *H02J 9/061* (2013.01); *H02J 9/062* (2013.01); *H05K 7/1492* (2013.01); *H02J 7/34* (2013.01); *H02J 7/35* (2013.01)

(58) Field of Classification Search
CPC ........ H02J 2300/28; G06F 1/30; G06F 1/189; G06F 1/263; G06F 1/3206; Y02B 10/70; Y02P 90/50
See application file for complete search history.

(56) References Cited

U.S. PATENT DOCUMENTS

| | | | |
|---|---|---|---|
| 7,236,896 B2 | 6/2007 | Farkas et al. | |
| 7,991,588 B1* | 8/2011 | Krieger | G06F 11/3034 |
| | | | 702/186 |
| 8,067,857 B2 | 11/2011 | Humphrey et al. | |
| 8,193,662 B1 | 6/2012 | Carlson et al. | |
| 8,464,080 B2 | 6/2013 | Archibald et al. | |
| 8,527,619 B2 | 9/2013 | Ewing et al. | |
| 8,595,379 B1 | 11/2013 | Brandwine | |
| 8,958,923 B2 | 2/2015 | Kake et al. | |
| 9,641,025 B2 | 5/2017 | Agrawal et al. | |
| 9,800,052 B2* | 10/2017 | Li | H02J 3/004 |
| 9,865,998 B1 | 1/2018 | Emert et al. | |
| 9,871,408 B2 | 1/2018 | Narita | |
| 10,014,713 B1* | 7/2018 | Nguyen | G06F 1/30 |
| 2003/0056125 A1 | 3/2003 | O'Conner et al. | |
| 2003/0085622 A1* | 5/2003 | Hailey | H02J 1/10 |
| | | | 307/52 |
| 2005/0071092 A1 | 3/2005 | Farkas et al. | |
| 2005/0162019 A1 | 7/2005 | Masciarelli et al. | |
| 2006/0082222 A1 | 4/2006 | Pincu et al. | |
| 2007/0216229 A1 | 9/2007 | Johnson, Jr. et al. | |
| 2007/0278860 A1* | 12/2007 | Krieger | H02J 9/061 |
| | | | 307/64 |
| 2008/0067872 A1* | 3/2008 | Moth | H02J 9/062 |
| | | | 307/23 |
| 2008/0320322 A1 | 12/2008 | Green et al. | |
| 2009/0144568 A1 | 6/2009 | Fung | |
| 2009/0158056 A1* | 6/2009 | Anderson | H02J 3/46 |
| | | | 713/300 |
| 2010/0037070 A1 | 2/2010 | Brumley et al. | |
| 2010/0037225 A1 | 2/2010 | Doyle et al. | |
| 2010/0058092 A1 | 3/2010 | Bougaev et al. | |
| 2010/0077238 A1 | 3/2010 | Vogman et al. | |
| 2010/0102633 A1 | 4/2010 | Seaton | |
| 2010/0205469 A1 | 8/2010 | McCarthy et al. | |
| 2010/0211810 A1 | 8/2010 | Nacho | |
| 2010/0264741 A1 | 10/2010 | Togare | |
| 2010/0328849 A1 | 12/2010 | Ewing et al. | |
| 2011/0006607 A1* | 1/2011 | Kwon | G06F 1/30 |
| | | | 307/66 |
| 2011/0133559 A1 | 6/2011 | Yamashita et al. | |
| 2011/0187197 A1* | 8/2011 | Moth | H02J 9/062 |
| | | | 307/66 |
| 2011/0245988 A1 | 10/2011 | Ingels et al. | |
| 2011/0264937 A1 | 10/2011 | Meisner et al. | |
| 2011/0298283 A1* | 12/2011 | Sannino | H02J 3/34 |
| | | | 307/38 |
| 2011/0302432 A1 | 12/2011 | Harris et al. | |
| 2011/0304211 A1 | 12/2011 | Peterson et al. | |
| 2012/0054512 A1 | 3/2012 | Archibald et al. | |
| 2012/0066519 A1 | 3/2012 | El-Essawy et al. | |
| 2012/0080942 A1* | 4/2012 | Carralero | H02J 3/383 |
| | | | 307/24 |
| 2012/0110350 A1* | 5/2012 | Horvath | G06F 1/263 |
| | | | 713/300 |
| 2012/0303993 A1 | 11/2012 | Nishtala et al. | |
| 2013/0198532 A1* | 8/2013 | Bailey | G06F 1/26 |
| | | | 713/300 |
| 2013/0212410 A1* | 8/2013 | Li | G06F 1/263 |
| | | | 713/300 |
| 2014/0229765 A1* | 8/2014 | Grimshaw | G06F 11/2015 |
| | | | 714/14 |
| 2014/0331070 A1* | 11/2014 | Du | G06F 1/28 |
| | | | 713/340 |
| 2015/0121113 A1* | 4/2015 | Ramamurthy | H02J 7/00712 |
| | | | 713/340 |
| 2015/0177808 A1* | 6/2015 | Sarti | G06F 1/30 |
| | | | 713/300 |
| 2015/0192978 A1* | 7/2015 | Ghose | G06F 13/409 |
| | | | 713/323 |
| 2015/0380968 A1* | 12/2015 | Lee | H02J 9/061 |
| | | | 713/300 |
| 2016/0020609 A1 | 1/2016 | Carrasco et al. | |
| 2016/0109916 A1* | 4/2016 | Li | H02J 7/35 |
| | | | 700/295 |
| 2016/0209901 A1 | 7/2016 | Wilcox et al. | |
| 2016/0285267 A1* | 9/2016 | Stone | H02J 3/32 |
| 2017/0005515 A1 | 1/2017 | Sanders | |
| 2017/0047772 A1* | 2/2017 | Wang | H05K 7/1492 |
| 2017/0170683 A1* | 6/2017 | Navarro | G06F 1/263 |
| 2017/0177047 A1 | 6/2017 | Fluman et al. | |
| 2017/0194791 A1* | 7/2017 | Budde | G06F 1/263 |
| 2017/0201425 A1 | 7/2017 | Marinelli et al. | |
| 2017/0294777 A1* | 10/2017 | Teymour Ghasemabadi | |
| | | | H02J 9/062 |
| 2017/0317525 A1* | 11/2017 | Navarro | H02J 9/061 |
| 2017/0322241 A1 | 11/2017 | Tang et al. | |
| 2018/0175618 A1* | 6/2018 | Lao | H02J 1/00 |
| 2018/0189432 A1* | 7/2018 | Leslie | G06F 9/4893 |
| 2018/0278088 A1* | 9/2018 | Toyoda | H02J 3/18 |
| 2018/0301930 A1* | 10/2018 | Gonzalez | H02J 9/062 |
| 2019/0044370 A1* | 2/2019 | Mondal | H02J 1/10 |
| 2019/0067988 A1* | 2/2019 | Ghosh | H02M 1/12 |

FOREIGN PATENT DOCUMENTS

| | | |
|---|---|---|
| KR | WO2012091323 A2 | 7/2012 |
| WO | WO2011119444 A2 | 9/2011 |

OTHER PUBLICATIONS

"VMware® Distributed Power Management Concepts and Use", White Paper, Copyright 2010 VMware, Inc., 3401 Hillview Avenue Palo Alto CA 94304 USA.

Mammano, Bob, "Load Sharing with Paralleled Power Supplies", Copyright 2001, Texas Instruments Incorporated, Dallas, Texas.

Muccini, Mark, el al., "Power Consumption Reduction: Hot Spare", A Dell technical white paper, Feb. 2012, Rev. 1.0, Dell, Inc.

Meisner, David, Brian T. Gold, and Thomas F. Wenisch. "PowerNap: eliminating server idle power." ACM SIGARCH Computer Architecture News 37.1 (2009): 205-216.

International Search Report dated Feb. 9, 2015 for PCT/US2014/062650.

(56) References Cited

OTHER PUBLICATIONS

International Search Report dated Jan. 30, 2015 for PCT/US2014/062684.

\* cited by examiner

DATACENTER POWER MANAGEMENT USING AC AND DC POWER SOURCES

RELATED APPLICATIONS

This application claims the benefit of U.S. provisional patent applications "Augmented Power Control Determination Within a Datacenter" Ser. No. 62/527,091, filed Jun. 30, 2017, "Data Center Power Scenario Simulation" Ser. No. 62/480,386, filed Apr. 1, 2017, "Secure Communication Initiation and Execution for Data Center Power Control" Ser. No. 62/511,130, filed May 25, 2017, "Datacenter Power Management Using AC and DC Power Sources" Ser. No. 62/523,732, filed Jun. 22, 2017, "Scalable Datacenter Power Infrastructure Management" Ser. No. 62/550,009, filed Aug. 25, 2017. This application is a continuation-in-part of U.S. patent application "Datacenter Power Management Using Variable Power Sources" U.S. Ser. No. 15/680,286, filed Aug. 18, 2017, which claims the benefit of U.S. provisional patent application "Automated Intelligent Scheduling of Energy Storage in Data Centers" Ser. No. 62/376,881, filed Aug. 18, 2016. Each of the foregoing applications is hereby incorporated by reference in its entirety.

FIELD OF ART

This application relates generally to power management and more particularly to datacenter power management using AC and DC power sources.

BACKGROUND

A datacenter, or more colloquially a "server farm", is a facility in which information technology (IT) operations and equipment are centralized for an organization. Datacenters have significant power requirements and organizations must therefore allocate a considerable portion of their operating budgets to cover the cost of electricity. Additionally, power demand can fluctuate based on various factors, such as the time of day or season. Organizations such as search providers, on-line retailers, financial institutions, research laboratories, universities, and other computing-intensive organizations, conduct operations using their datacenters. A typical datacenter houses a network of varied, critical systems, the continuous operations of which is vital to the organization. The critical systems can include servers, storage devices, routers, and other IT equipment. The critical systems can be mounted in rows of equipment racks, also called data racks or information technology racks. Because the proprietary, confidential, and personal information stored on and processed by these critical systems must be protected, the security and reliability of datacenters and the information within them is a top priority for the organizations.

Computer systems are comprised of a vast number of components, each of which consume power. These components include printed circuit boards populated with integrated circuits or "chips", mass storage devices, networking interfaces, and processors. Given the precise and ever-increasing power requirements demanded by these components, reliable and efficient power delivery is crucial to operation of the server farms. The computer systems must meet or exceed predetermined statutory requirements for reliability and availability. Financial institutions and healthcare organizations are required by law to meet certain standards for protection of data. Additionally, educational organizations and retail businesses face other statutory requirements which demand that certain standards must be met to protect personal educational and consumer data. The statutory requirements often place stringent safeguards on the physical and technical security of personal data.

Design issues such as availability, reliability, and job load, among others, demand that additional infrastructure requirements be met. One design issue involves effectively cooling a data center (i.e. the removal of excess heat). The removal of the excess heat is a critical issue which must be addressed to ensure stable and reliable operation of the datacenter. Each of the many devices in the data center generates substantial amounts of heat, whether the device is a server, a blade server, a switch, a backup unit, a communications unit, or another device. In fact, the issue of cooling modern data centers has become such an important design criterion that it directly impacts the layout and design of the center. Some data centers are arranged in so called "hot rows" and "cold rows," where equipment generating excess heat is grouped together in "hot rows" and surrounded by rows of cooler-running equipment grouped in "cold rows," The cold rows are named for their ability to serve as heat sinks for the hot rows, absorbing some of the excess heat from the "hot" equipment. Other centers are designed with cooling devices placed adjacent to significantly hot devices, where the cooling devices include fans, air conditioning units, water cooling systems, and so on. Another significant data center design consideration involves providing sufficient power to the data center. Particularly in the case of high-reliability data centers, power can be provided by more than one power grid to provide redundancy, while for other data centers, power can be provided by a combination of a power grid, locally generated power, renewable power, and backup power. Regardless of how the power is provided to the data center, providing reliable and efficient power to the large number of computers and associated equipment in modern datacenters is the critical design criterion of successful operation of such facilities.

SUMMARY

The power requirements for a data center are typically dynamic in nature. The power requirements depend on the electronic and electrical equipment within the datacenter and can be based on AC loads and DC loads. The power requirements of the datacenter can vary over time based on application activity, planned maintenance, unplanned equipment failure, and other factors. Further, the power requirements of a datacenter can be time dependent based on application activity, planned maintenance, unplanned equipment failure, and other factors. The time-variable power requirements can include increases during normal business hours, and subsequent decreases after business hours and/or on weekends. The makeup of AC load demand vs. DC load demand can also change. Datacenters provide vital functions for businesses, governments, educational institutions, and other enterprises. Characterizing the behavior of datacenter power consumption is essential to maintain consistent reliability of the datacenters. Software Defined Power supports datacenter power requirements and includes 1N redundancy, 2N redundancy, carbon footprint management, cost of energy, or source of energy.

Disclosed techniques address datacenter power management using AC and DC power sources. An AC power distribution topology provides one or more AC power sources to computing devices within the datacenter. A DC power distribution topology provides one or more DC power sources to computing devices within the datacenter in addition to the AC power distribution topology. An uninterruptible power supply (UPS) is provisioned to a rack of computing devices within the datacenter, wherein the UPS is capable of receiving the one or more AC power sources using the AC power distribution topology and the one or more DC power sources using the DC power distribution topology. The one or more DC power sources are evaluated for energizing the DC power distribution topology. The one or more DC power sources are connected to the UPS which is provisioned to the rack of computing devices based on the datacenter power requirements. Similarly, the one or more AC power sources are evaluated for energizing the AC power distribution topology. The one or more AC power sources are connected to the UPS which is provisioned to the rack of computing devices, based on the evaluating the one or more AC power sources, the evaluating the one or more DC power sources, and the datacenter power requirement. The evaluating the one or more AC power sources, the evaluating the one or more DC power sources, the connecting the one or more AC power sources, and the connecting the one or more DC power sources, are controlled using a software-defined power infrastructure.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
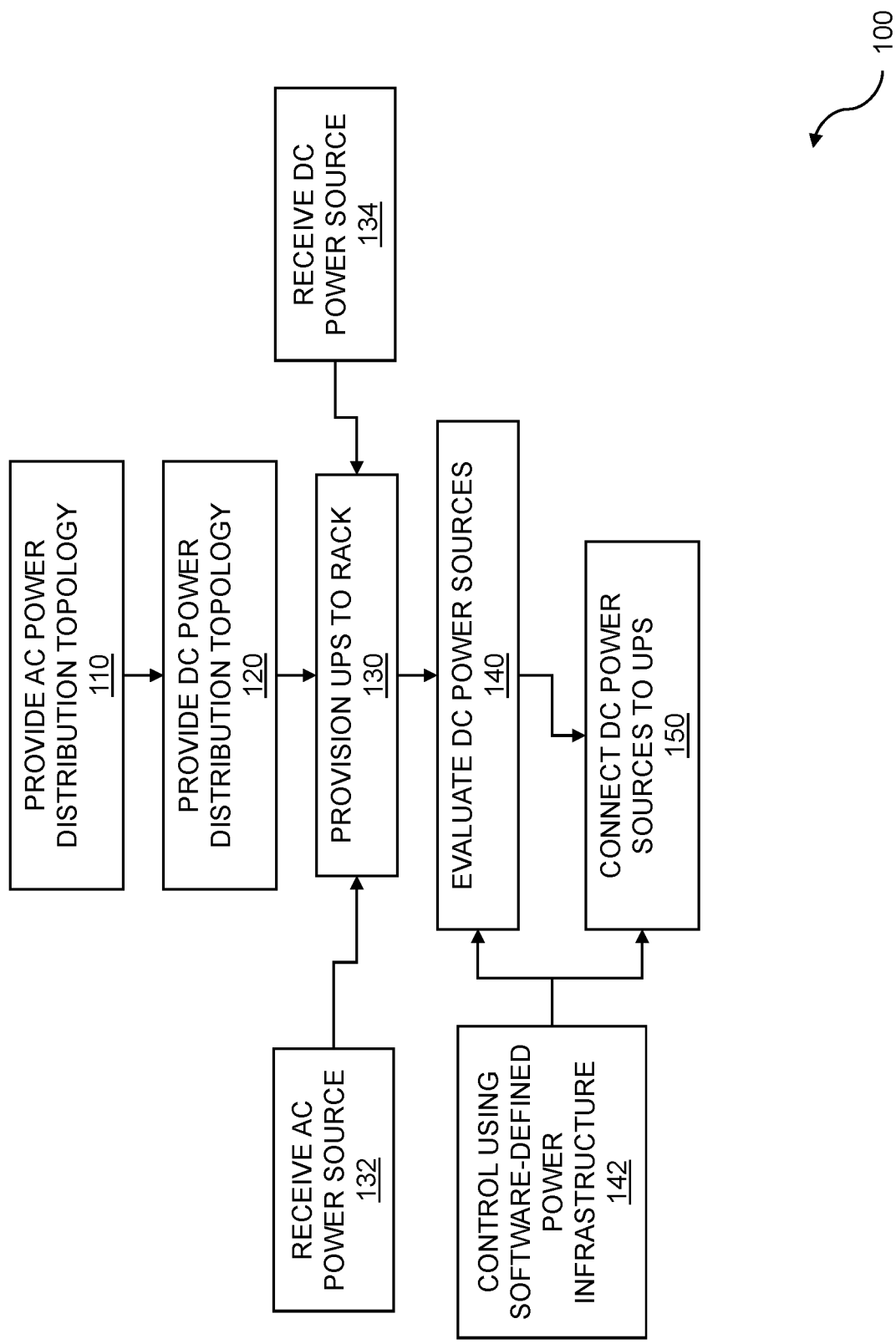
FIG. 1 is a flow diagram for datacenter power management using AC and DC power sources.

This disclosure provides techniques for datacenter power management using AC and DC power sources. Managing power distribution for efficiency and reliability can be challenging, particularly in datacenters. Datacenter power systems are designed to meet the dynamic power needs of large installations of diverse electrical equipment. The wide range of electrical equipment in a datacenter can include devices such as servers, blade servers, communications switches, backup data storage units, communications hardware, and other devices. The electrical equipment can include one or more of processors, data servers, server racks, and heating, ventilating, and air conditioning (HVAC) units. The HVAC units are installed to deal with the copious amount of heat that is generated by the various electrical equipment in the datacenter. The power systems receive power from multiple power feeds, where the coupled power feeds can derive power from a grid, such as from traditional coal, natural gas, or nuclear-powered sources, or from other hydro, wind, or solar sources. Alternatively or additionally, the power feeds can derive power from local power generation such as micro-hydro, wind, solar, or geothermal, diesel generator (DG) sets, and so on. The multiple power feeds, which typically number at least two, provide critical redundancy in delivery of power to the datacenter power system. That is, if one power feed were to go down or be taken offline for maintenance, then another power feed can provide the dynamic power needed to drive the power load of large equipment installations, such as datacenters. The power feeds are coupled to master switch blocks (MSB), switch blocks (SB), and uninterruptable power supplies (UPS). In some embodiments, one or more power distribution units (PDU) are connected within the power distribution system. The PDUs can be coupled to one or more electrical loads and distribute dynamic power to the various loads. The loads can include widely varying dynamic loads, such as those presented by the electrical equipment found of the datacenters. The power provided can be based on a specific voltage, current, wattage, multiple voltages, currents, and wattages, etc. The UPS units can provide multiple functions such as overvoltage limiting, under voltage limiting, battery backup, charge control, inversion (e.g. convert D.C. battery power to A.C. power), etc. Similar to the multiple power feeds, each UPS can provide sufficient power to drive the dynamic power loads coupled to a given feed. Each central UPS continues to provide power until the batteries in the UPS discharge to a certain level of remaining charge.

Power control within a datacenter can be based on a software-defined power control infrastructure. Individual data racks can include modified UPS components, such that each modified UPS component can receive either DC or AC power, which can be controlled by the software. The software can be used to optimize the release of power and to tune and balance the mix of AC and DC power. DC current can be controlled further by upstream software to specify a mix of power from one or more power sources including utility, generator, solar panels, batteries, and other energy sources including renewable sources. Power policy priorities can be set. For example, policies can be set at the rack level, the server level, and other IT equipment priority levels. Policies can also be set at the datacenter level. The policies can be used for defining power redundancy requirements from the software.

Rack, server, and any IT equipment can have a defined priority, which can be the basis of defining power redundancy from software. Power can be adequately provided or stopped altogether based on priority and desired objectives. The datacenter power requirements can include 1N redundancy, 2N redundancy, carbon footprint management, cost of energy, source of energy, and so on. Software can tune the power sources and redundancy requirements, based on a variety of objectives, to distribute power, mix power sources, mix AC and DC power, and to provide redundancy across racks, rows, and the data center distribution. The software can provide access to and control of the power topology and redundancy through an API. The API can provide an interface to a higher-level scheduler for placement of workloads on computing devices based on a power policy.

Capacity management in the power system is managed by software. The techniques disclosed herein can include a system based on a redundancy policy, where the redundancy policy is based on a power capacity management technique utilizing predictive algorithms. The predictive algorithms can be trained, where the training is based on measuring results of the predictive algorithms to forecast power needs. The training can improve predictive algorithm accuracy over time. Two interfaces to power systems are described. The southbound interface to the power system components can continuously gather operational data and can issue policies to the power system components. An autonomous agent can include a compliant power system component with a policy to react in milliseconds to changes in the power system. The resulting distributed intelligence control approach can create a nimble management process that is able to adapt as needed to support availability of power capacity. The northbound API can support access to a workload management system. The northbound API can exchange information based on both current operational status and what transactions may be imminent. When a declaration of pending transactions is issued, the receiver can acknowledge and react in a manner that maintains system stability.

The software can perform several management tasks to support using AC and DC power sources. The management software can be one component or can be partitioned into a plurality of components. The components can perform one or more tasks. A software component can manage AC power of the racks, rows, and the entire power system using the DC power system. This software component can be used to enforce AC power limits regardless of server power demand. The algorithms performed can be programmed to maintain higher battery life while providing highest utilization. Batteries that provide DC power can be co-located or distributed. The batteries can be treated as one virtual battery to meet the power needs. A software component can manage dynamic redundancy in applications. This component can provide power capacity that would normally be held in reserve for redundancy, but may be utilized in a policy-based capacity management system. A software component can manage functions that increase the capacity of the power system, based on predetermined design limits, or to reduce utility power draw. Power sources such as the distributed batteries (virtual battery) within the system or the generator may be used. Solar or wind power systems may be used to augment the power system and reduce utility power when the sources are available. Software can decouple the load demand from the utility supply by using peak shaving techniques to level load demand over time. A software component can orchestrate workload power functions with the host through what is described above as the northbound API. One or more of the software components may be present at the same time. The one or more software components can be independently deployed as per the requirements or the need for specific power optimization required.

In disclosed techniques, a computer-implemented method for power management is used for datacenter power management using AC and DC power sources. An AC power distribution topology is provided within a datacenter to provide one or more AC power sources to computing devices within the datacenter. A DC power distribution topology is provided within the datacenter to provide one or more DC power sources to computing devices within the datacenter in addition to the AC power distribution topology. An uninterruptible power supply is provisioned to a rack of computing devices within the datacenter, wherein the UPS is capable of receiving the one or more AC power sources using the AC power distribution topology and the one or more DC power sources using the DC power distribution topology. The one or more DC power sources are connected to the UPS which is provisioned to the rack of computing devices, based on the evaluating and a datacenter power requirement. The one or more AC power sources are evaluated for energizing the AC power distribution topology. The one or more AC power sources are connected to the UPS which is provisioned to the rack of computing devices, based on the evaluating the one or more AC power sources, the evaluating the one or more DC power sources, and the datacenter power requirement. The evaluating the one or more AC power sources, the evaluating the one or more DC power sources, the connecting the one or more AC power sources, and the connecting the one or more DC power sources, are controlled using a software-defined power infrastructure.

FIG. 1 is a flow diagram for datacenter power management using AC and DC power sources. Evaluating and connecting the one or more DC power sources is controlled by using a software-defined power infrastructure. The flow 100 shows a processor-implemented method for power management. The power management can be in support of datacenter power requirements including 1N redundancy, 2N redundancy, carbon footprint management, cost of energy, or sources of energy. The flow 100 includes providing an AC power distribution topology 110 within a datacenter to provide one or more AC power sources to computing devices within the datacenter. The AC power distribution can include a variety of sources including grid power, AC diesel-generator power, renewable power, and so on. The AC power distribution can include automatic transfer switches (ATS), stepdown transformers, circuit breakers, and other distribution equipment to distribute AC power to data racks in a datacenter. The flow 100 includes providing a DC power distribution topology 120 within the datacenter so that one or more DC power sources are available to computing devices within the datacenter in addition to the AC power distribution topology. The DC power distribution topology can also include one or more ATSs, circuit breakers, etc. The DC power sources can include a DC generator. The DC power sources can include renewable, ecologically conscious, or "green" energy sources. The renewable DC power sources can include local sources, community sources, regional sources, etc. The renewable energy DC sources can include solar power, hydro power, or wind power. The renewable energy DC sources can also include battery power, micro-hydro power, geothermal power, tidal power, wave-action power, and so on.

The flow 100 includes provisioning an uninterruptible power supply to a rack 130 of computing devices within the datacenter, wherein the UPS is capable of receiving the one or more AC power sources using the AC power distribution topology and the one or more DC power sources using the DC power distribution topology. The UPS can provide AC power and DC power to various components in a data rack. The DC power can be inverted to provide AC power when the AC power source is either unavailable or otherwise unable to provide all of the AC power required. AC power can be rectified to provide DC power. The provisioning the UPS to a rack can include receiving an AC power source 132 via the AC power distribution topology. The AC power source can include grid (utility) power, diesel-generator power, alternative power, and so on. The provisioning the UPS to a rack can include receiving a DC power source 134 via the DC power distribution topology. The DC power source can include DC generator power, power from storage such as batteries, alternative power such as solar, hydro, or wind power, etc.

The flow 100 includes evaluating the one or more DC power sources 140 for energizing the DC power distribution topology. The evaluating the one or more DC power sources can include evaluating battery charge, determining whether sufficient power is available from wind, hydro, or solar sources, that a DC generator is online, and so on. As discussed elsewhere, the evaluating one or more power sources can include evaluating one or more AC power sources. The DC power sources and the AC power sources can be controlled. Further embodiments include controlling any of the following: the evaluating the one or more AC power sources, the evaluating the one or more DC power sources, the connecting the one or more AC power sources, and the connecting the one or more DC power sources, using a software-defined power infrastructure 142. The software-define power infrastructure can be based on code provided by a client, a datacenter systems operator (sysop), the owner of the datacenter, and so on. The software-defined power infrastructure can be used to select power sources, to configure the AC power distribution topology, to configure the DC power distribution topology, to provision UPSs to racks, and the like. In embodiments, the software-defined power infrastructure controls the evaluating and the connecting in a dynamic manner. The software-defined power infrastructure can adapt "on the fly" to changes in power loads, power source availability, power costs, carbon footprint considerations, and so on.

The flow 100 includes coupling the one or more DC power sources to the UPS 150 which is provisioned to the rack of computing devices, based on the evaluating of a datacenter power requirement. The connecting of sources can be accomplished using a variety of techniques including using a power distribution unit (PDU) which may be located in the IT rack, in a row of IT racks, within the datacenter, and so on. In embodiments, the connecting can be triggered by a power source failure. The flow 100 includes controlling the evaluating and the connecting using a software-defined power infrastructure 142. The software-defined power infrastructure can be based on modified UPSs. The modified UPSs can be programmed based on a policy. The policy can be downloaded from the Internet, uploaded by a systems operator (sysop), and so on. The software-defined power infrastructure can control the evaluating and the controlling in a dynamic manner. The software-defined power infrastructure can be based on machine learning, where the machine learning can include deep learning. The deep learning can be used to learn power control policies. The power control policies can be improved over time by learning the effectiveness of previous power requirement predictions. Various steps in the flow 100 may be changed in order, repeated, omitted, or the like without departing from the disclosed concepts. Various embodiments of the flow 100 can be included in a computer program product embodied in a non-transitory computer readable medium that includes code executable by one or more processors.

Figure 2:
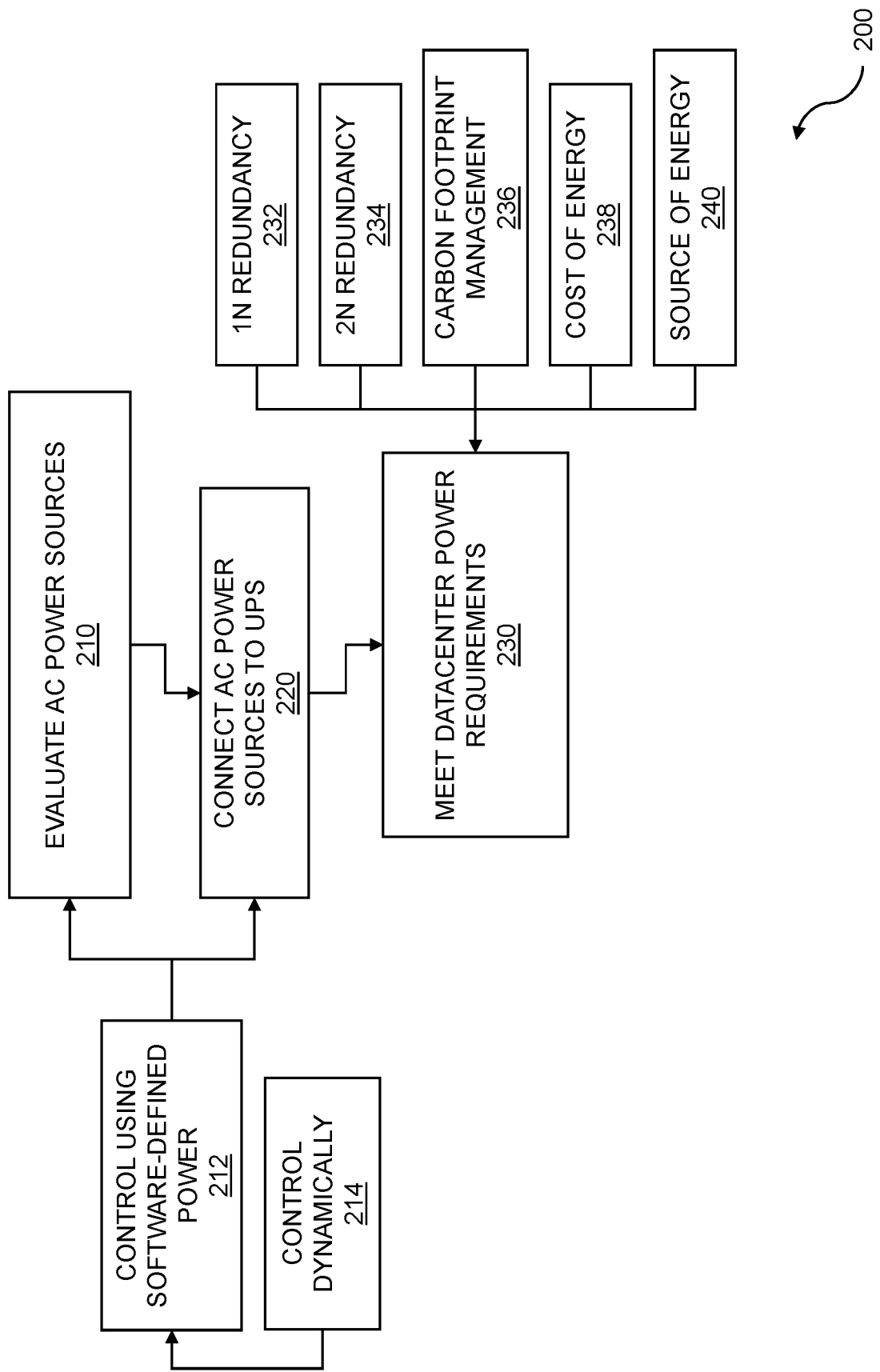
FIG. 2 is a flow diagram for power source evaluation.

FIG. 2 is a flow diagram for power source evaluation. Power sources provide the energy required to operate a datacenter. The power is used to operate computing devices, communications equipment; uninterruptable power supplies; heating, cooling and air conditioning (HVAC) equipment; and so on. Datacenter power management uses alternating current (AC) sources and direct current (DC) sources. The AC sources and DC sources can be derived from utilities, local generators and storage, renewable energy sources, and the like. The power sources within the datacenter can be managed based on power loads, energy cost, seasonal parameters, etc.

The flow 200 includes evaluating the one or more AC power sources 210 for energizing the AC power distribution topology. The evaluating the one or more AC power sources can include determining any of the following: a power load on an AC source, a percentage power source capacity usage, time of use, carbon footprint, cost, and so on. As discussed previously, the AC power sources can be controlled. Embodiments further include controlling 212 the evaluating and connecting the one or more AC power sources using a software-defined power infrastructure. The controlling can include selecting a power source, enabling a power source, taking a power source offline, etc. In embodiments, the software-defined power infrastructure can control 214 the evaluating and the connecting in a dynamic manner. The dynamic power control can adapt to changing power load requirements, changes in seasonal parameters, updated computational job mixes, availability of power sources, and the like.

The flow 200 further includes connecting the one or more AC power sources to the UPS 220 which is provisioned to the rack of computing devices, based on the evaluating the one or more AC power sources and the datacenter power requirement. The connecting the one or more AC power sources can be accomplished using an AC power distribution topology. The UPS to which the AC power sources are connected can be a UPS provisioned for a data rack, a UPS provisioned for a row of data racks, and so on. Note that data racks are also referred to as information technology racks. The flow 200 includes meeting datacenter power requirements 230. The meeting of datacenter power requirements can be determined based on power load requirements, power source capabilities, power source availability, etc. The meeting of datacenter power requirements can be based on datacenter design, contractual agreement, and so on. In embodiments, the datacenter power requirement includes 1N redundancy 232. 1N redundancy can include a principal power source such as utility power and one backup such as a diesel-generator set. In other embodiments, the datacenter power requirement includes 2N redundancy 234. In 2N redundancy, there is a second source for every principal power source. A second utility power source can support 2N redundancy. In further embodiments, the datacenter power requirement includes carbon footprint management 236. Management of the carbon footprint for the datacenter can include reductions in power usage, changes in power generation fuels, use of renewable energy sources, etc. Renewable energy sources can include solar power, hydro power, or wind power. Renewable energy sources can include geothermal power, tidal power, wave-action power, and so on. In embodiments, the datacenter power requirement includes cost of energy 238. Some energy sources can be more expensive based on time of day, seasonal parameters, availability, and so on. A cost of energy reduction scenario can include storing power when the cost of power from the energy source is low, then drawing from the stored energy when the cost of power from the energy source is high. In another embodiment, the datacenter power requirement includes the source of energy 240. The source of energy can be selected based on other parameters such as carbon footprint, cost, and so on, as well as power source availability, contractual requirements for the datacenter, etc. Various steps in the flow 200 may be changed in order, repeated, omitted, or the like without departing from the disclosed concepts. Various embodiments of the flow 200 can be included in a computer program product embodied in a non-transitory computer readable medium that includes code executable by one or more processors.

Figure 3:
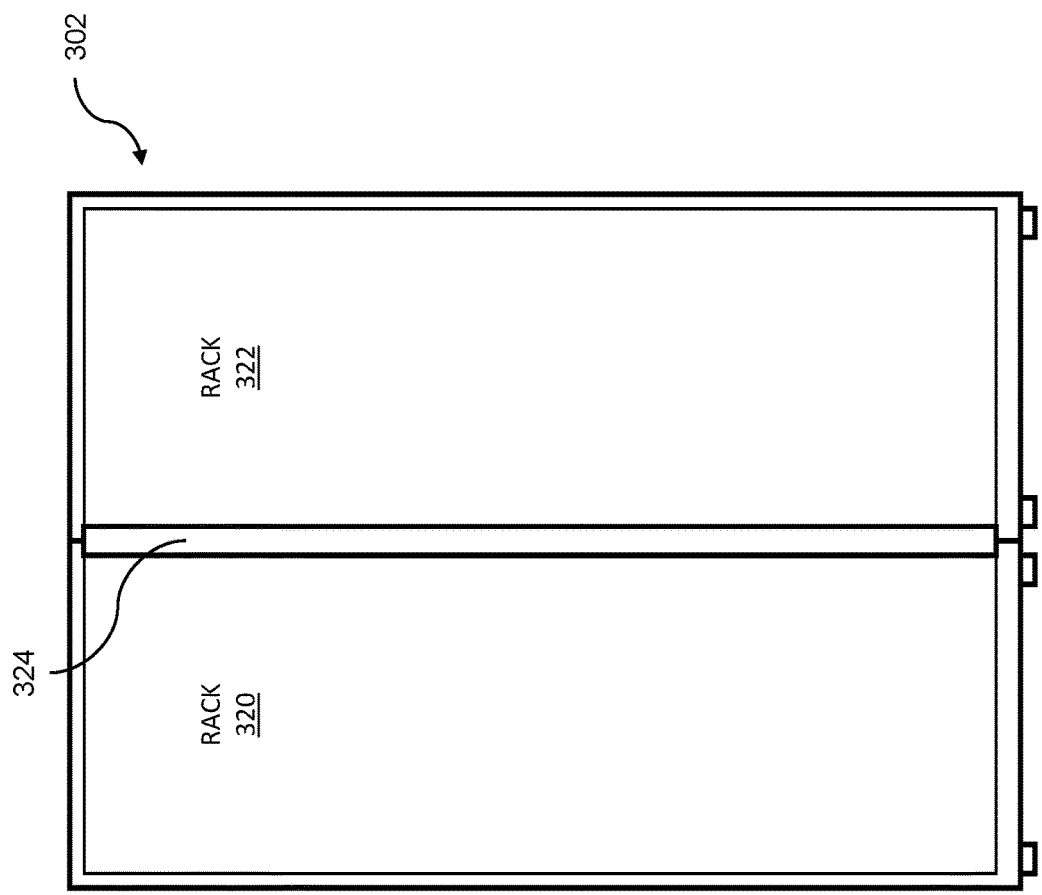
FIG. 3 shows example rack and power configurations.
Figure 3:
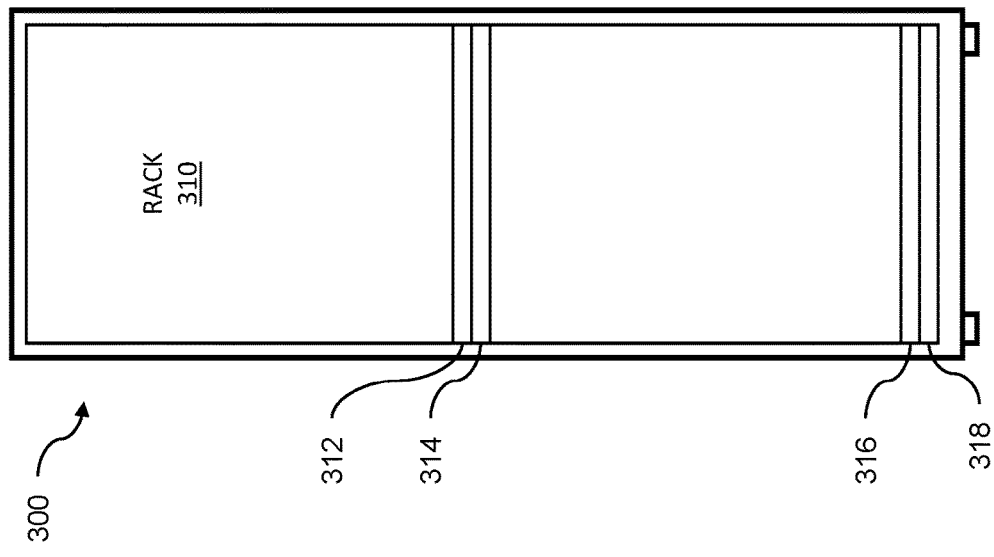

FIG. 3 shows example rack and power configurations. Data racks can contain computing equipment, communication equipment, and other electrical equipment. The electrical equipment can include power supplies, batteries, uninterruptable power supplies, and so on. The electrical equipment within the data racks can be powered from alternating current sources and direct current sources. A plurality of data racks can be placed within a datacenter. The power to the data racks can be managed and configured using a software-defined power infrastructure. The figure shows two example rack and power configurations, a first configuration 300, and a second configuration 302. One or more batteries, one or more power supplies, a plurality of connectors, a plurality of power sensors, a plurality of load sensors, and controllers can comprise a consolidated rack mount power system. An example system is shown in the first configuration 300 which includes rack 310, in turn composed of consolidated rack mount power systems 312, 314, 316, and 318. The one or more batteries, the plurality of power supplies, the plurality of connectors, the plurality of power sensors, the plurality of load sensors, the plurality of converters, and the controllers can comprise a consolidated side mount power system. An example setup is shown in the second configuration 302 which includes a first rack 320 and a second rack 322, together composing a consolidated side mount power system 324 placed between the first rack 320 and the second rack 322. The consolidated rack mount power system and the consolidated side mount power system can be stackable. For example, consolidated rack mount power systems 312 and 314 are stacked one on top of the another in adjacent rack spaces. The rack mount power systems can be evaluated and connected to the various electrical components contained with the racks 310, 320, and 322. The evaluating and connecting the AC and DC power sources, and the controlling the power sources, can be accomplished using a software-defined power infrastructure. In embodiments, the software-defined power infrastructure can control the evaluating and the connecting in a dynamic manner.

The stacking can provide for N+ parallelization. N+ parallelization refers to a number of additional power supplies beyond the required number which are kept as standby or reserve power supplies. For example, if a particular cluster of racks requires six power supplies, an N+1 configuration would provide seven power supplies, an N+2 configuration would provide eight power supplies, and so on. The stacking can also provide for 2N parallelization. Again, using the example of six required power supplies, a 2N parallelization scheme would provide 12 power supplies. In the 2N redundancy configuration, any critical path in the power system is replicated to remove single points of failure and increase robustness. The consolidated side mount power system can also provide power across multiple racks. For example, a single consolidated side mount power system 324 can provide power across a first rack 320 and a second rack 322.

Figure 4:
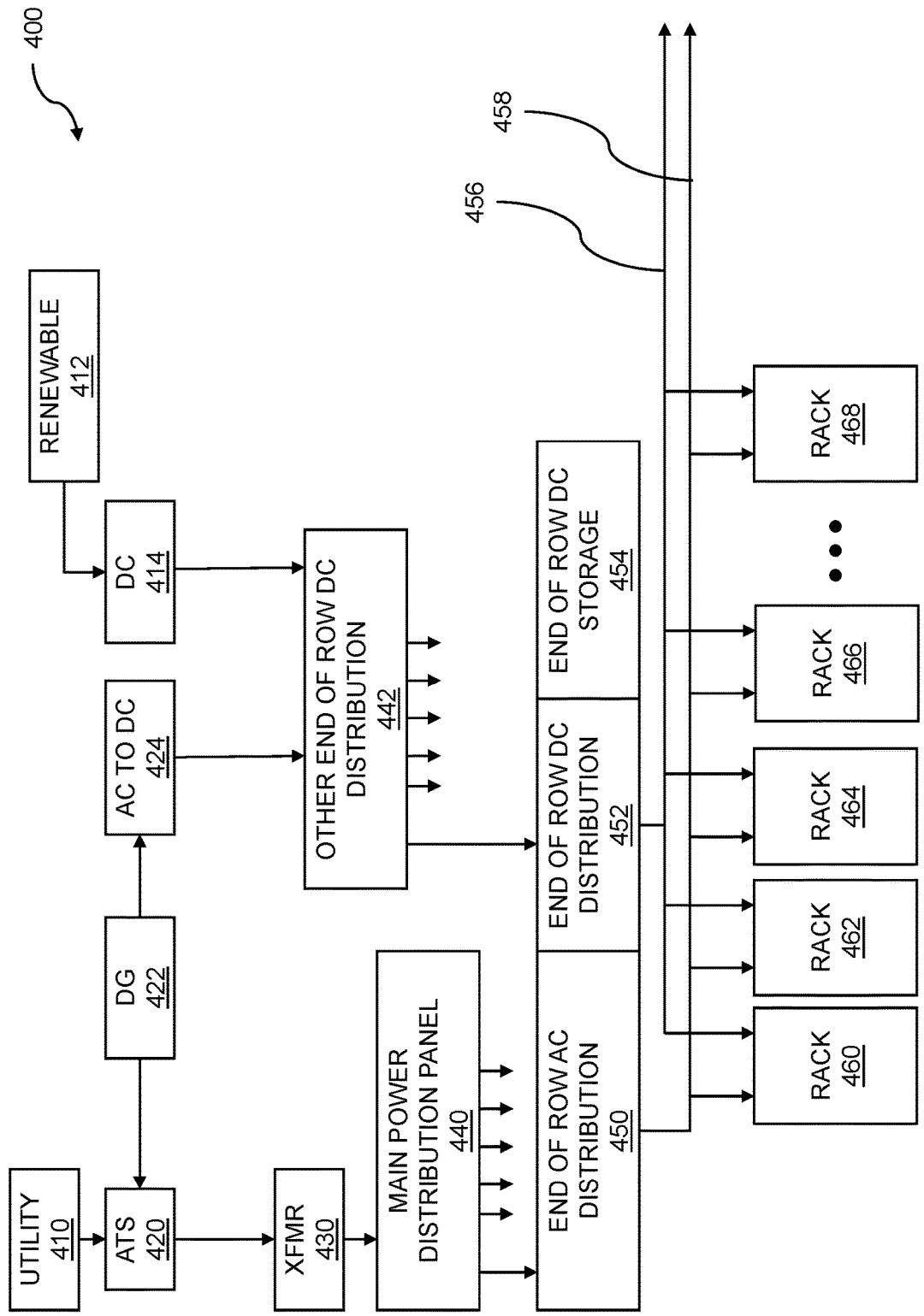
FIG. 4 illustrates a single-line power topology.

FIG. 4 illustrates a single-line power topology. Power, including alternating current power and direct current power, can be provided to a datacenter. The AC power and the DC power can be connected to an AC power topology and a DC power topology respectively within the datacenter to provide power to data racks. The data racks contain computing equipment, communications equipment, and other electrical equipment. The AC power and the DC power can be managed.

A single-line topology 400 is shown. A single-line topology can include a single utility system such as a power feed from a single utility 410. The single utility can use a variety of fuel sources such as natural gas, coal, nuclear sources, and so on to generate power. The single-line topology can include a second power source such as alternative power or backup power. The second power source can include renewable energy sources 412, where the renewable energy sources can generate AC power or DC power. In embodiments, the renewable energy DC 414 sources can include solar power, hydro power, or wind power. Other renewable sources can include tidal power, wave power, geothermal energy conversion, etc. In embodiments, an inverter can be used to convert from DC power to AC power. A backup power source can include a diesel-generator set 422. Depending on the configuration of the DG set, the set can be configured to generate AC power, DC power, or both AC power and DC power. In embodiments, the DC power sources include a DC generator. An AC to DC converter 424 can be used to convert the AC power generated by the DG set into DC power. An automatic transfer switch (ATS) 420 can select between power sources based on whether utility power is available, datacenter power policies, etc.

Alternating current utility power or power from another AC source can be stepped down using a step-down transformer (XFMR) 430. The output of the step-down transformer can be coupled to a main power distribution panel 440. The main power distribution panel can distribute AC power within a datacenter. DC power, whether supplied from batteries, renewable sources, an AC-to-DC converter, etc., can be coupled to an end of row DC distribution panel 442. AC power and DC power can be fed through circuit breakers. The circuit breakers (not shown) can protect the various units of electrical and electronic equipment located within the datacenter. AC power from the main power distribution panel can be directed to rows of data racks within the datacenter. Power from the main AC power distribution panel can be coupled to one or more end of row AC power distribution 450 panels. In embodiments, the rack of computing devices can further include a power distribution center for the rack. DC power from the other end of row DC distribution can be directed to one or more end of row DC distribution 452 panels. In embodiments, the power distribution center for the rack can include the AC power inputs, the DC power inputs, and a battery backup system. The battery backup system can include an uninterruptable power source. In embodiments, the battery backup system includes end of row DC storage 454. The end of row DC storage can be coupled to the end of row DC distribution, coupled to racks in the datacenter, and so on.

The power requirements of the datacenter can include redundancy, power policies, contractual obligations, and other requirements. In embodiments, the datacenter power requirement can include 1N redundancy, 2N redundancy, carbon footprint management, cost of energy, or source of energy. Power can be allocated to a data rack within the data center based on the requirements. AC power and DC power can be connected to a data rack within a data center. Further embodiments can include an additional rack of computing devices. The computing and other devices placed in the data racks can include servers, blade servers, backup and storage equipment, communications equipment, and so on. Racks within the datacenter can be provisioned with uninterruptable power supplies. In embodiments, the additional rack of computing devices can be provisioned with an additional uninterruptible power supply, where the additional UPS can be capable of receiving the one or more AC power sources using an AC power distribution topology and the one or more DC power sources using a DC power distribution topology. The provisioning of the racks can be based on evaluating one or more power sources. In embodiments, the evaluating the one or more DC power sources can be performed for both the rack and the additional rack. The evaluating can be performed on all racks, on a sampling of racks, on a subset of racks, and so on. Other embodiments can further include connecting the one or more DC power sources to the additional UPS, based on the evaluating and the datacenter power requirement. The connecting the AC power sources and the DC power sources for the racks within the datacenter can be scheduled. The schedule for connecting the AC power sources and the DC power sources can be static. In embodiments, the coupling the one or more DC power sources to the UPS and the additional UPS can be dynamically updated based on real-time power needs of the rack and the additional rack.

AC power from the end of row AC power distribution, the end of row DC power distribution, and the end of row DC power storage can be routed to racks within the datacenter. The racks are placed in rows in the datacenter, where the rows can include twelve racks or another number of racks. Electronic equipment that requires AC power can be collocated in AC power racks, and electronic equipment that requires DC power can be collocated in DC power racks. In some embodiments, equipment that requires AC power and equipment that requires DC power are collocated within the same rack. The data racks, such as data racks 460, 462, 464, 466, and 468 can be coupled to the end of row AC distribution 450 using a distribution bus 458. The data racks can be coupled to the end of row DC distribution 452 using a distribution bus 456. The end of row DC storage 454 can be coupled to the end of row DC distribution 452 as shown or can be coupled to one or more racks within the data center.

Figure 5:
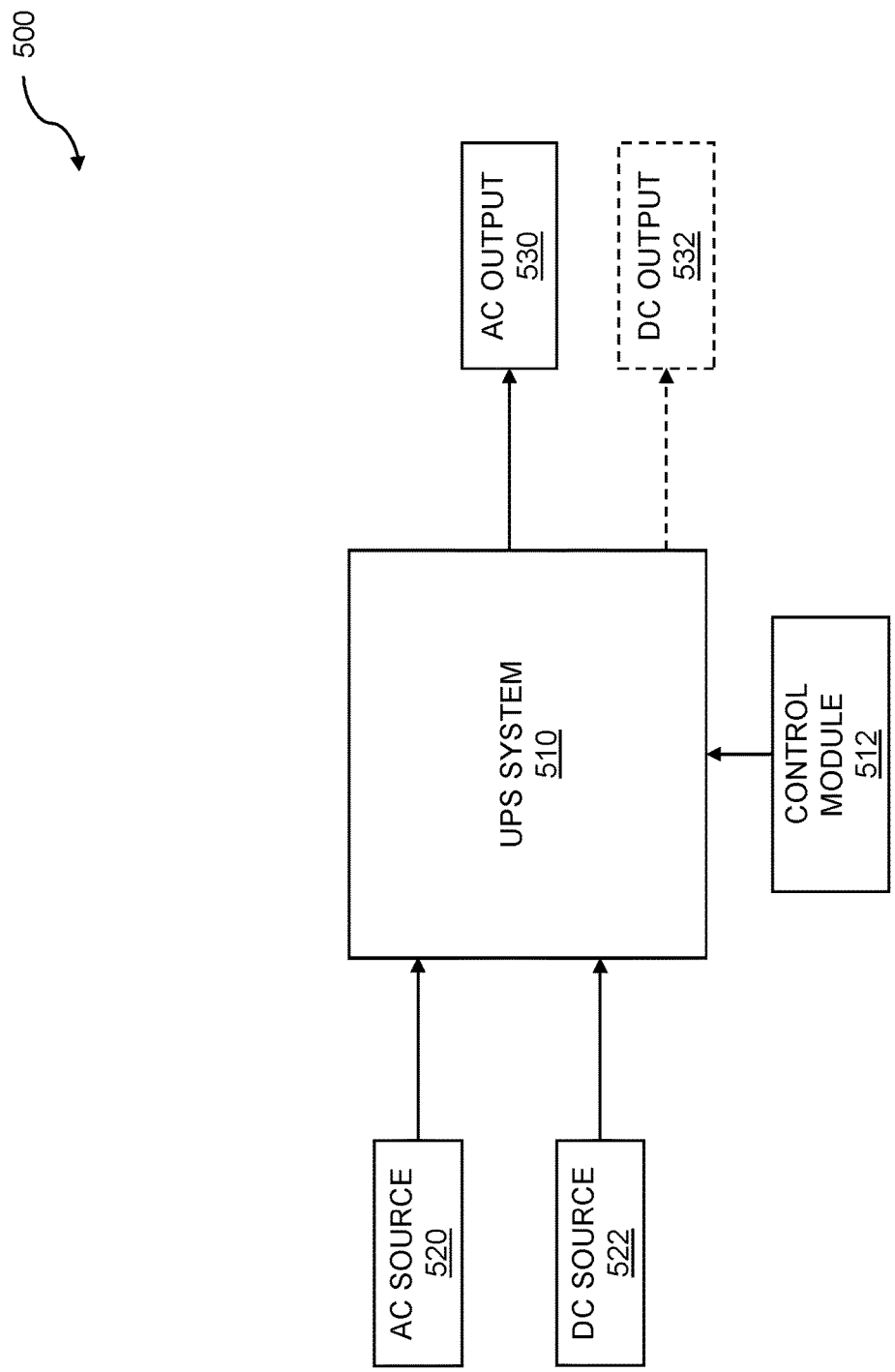
FIG. 5 shows example dual-input AC UPS.

FIG. 5 shows example dual-input AC UPS. One or more uninterruptable power supplies can be included in datacenter power management using AC and DC power sources. The UPS units can be deployed within a datacenter to protect computation equipment, communications equipment, and other electronic and electrical equipment. The UPS units can be provisioned to one or more racks of the equipment in the datacenter. The one or more UPS units can protect the racks of equipment against power surges, low voltage conditions, and power outages. The one or more UPS units can receive one or more AC power sources using an AC power distribution topology and one or more DC power sources using a DC power distribution topology.

An example dual-input AC UPS is shown 500. The UPS 510 includes control module 512 which receives software operating instructions based on a power policy. The software operating instructions can be used as part of a software-defined power infrastructure. In embodiments, the software-defined power infrastructure can control evaluating and the connecting of the UPS to equipment within a datacenter in a dynamic manner. The instructions can be provided to the control module via a computer network, where the computer network can be wired network, a wireless network, a hybrid network, and so on. An AC source 520 can be provided to the UPS system. The AC source can include any AC power source such as grid power, AC diesel-generator power, alternative power, and so on. A DC source 522 can be provided to the UPS system. The DC power source can be connected to grid tied inverters (GTI). The outputs of GTIs can be fed into the AC Lines. The DC source 522 can include batteries and renewable power sources such as solar power, hydro power, or wind power. Other renewable and ecologically salubrious power sources can include micro-hydro power, geothermal power, tidal power, wave-generated power, and so on.

The modified UPS system can perform several operations. Under normal operating conditions, power can pass directly through the UPS unit 510 to the AC output 530. The DC source 522 can couple to a grid tied inverter coupled to the AC power pathway between the AC input and the AC output. The UPS can operate on the AC source normally. When a policy is set by a Software Defined Power (SDP) system, the UPS can use the DC source 522 to load-share with the AC source 520 in a grid-tied configuration. If the AC source 520 were to fail or to be taken offline, the UPS system 510 can isolate itself from the AC source 520 and can run from the DC 522 source. The UPS can provide an output signal with constant voltage and constant frequency parameters. The UPS system 510 can continuously operate on either the DC and AC feeds. When the UPS system is operating on the AC feed, DC peak shaving can be performed. When DC peak shaving occurs, the AC input power can be capped based on the peak shaving limit that has been set by the SDP system. In some embodiments, UPS system 510 can provide a DC output 532 to power the rack. In such embodiments, the UPS system 510 conditions and converts AC source 520 into the DC output. The UPS system can also condition and convert the DC source to provide one or more DC voltages at the output of the UPS system.

Figure 6:
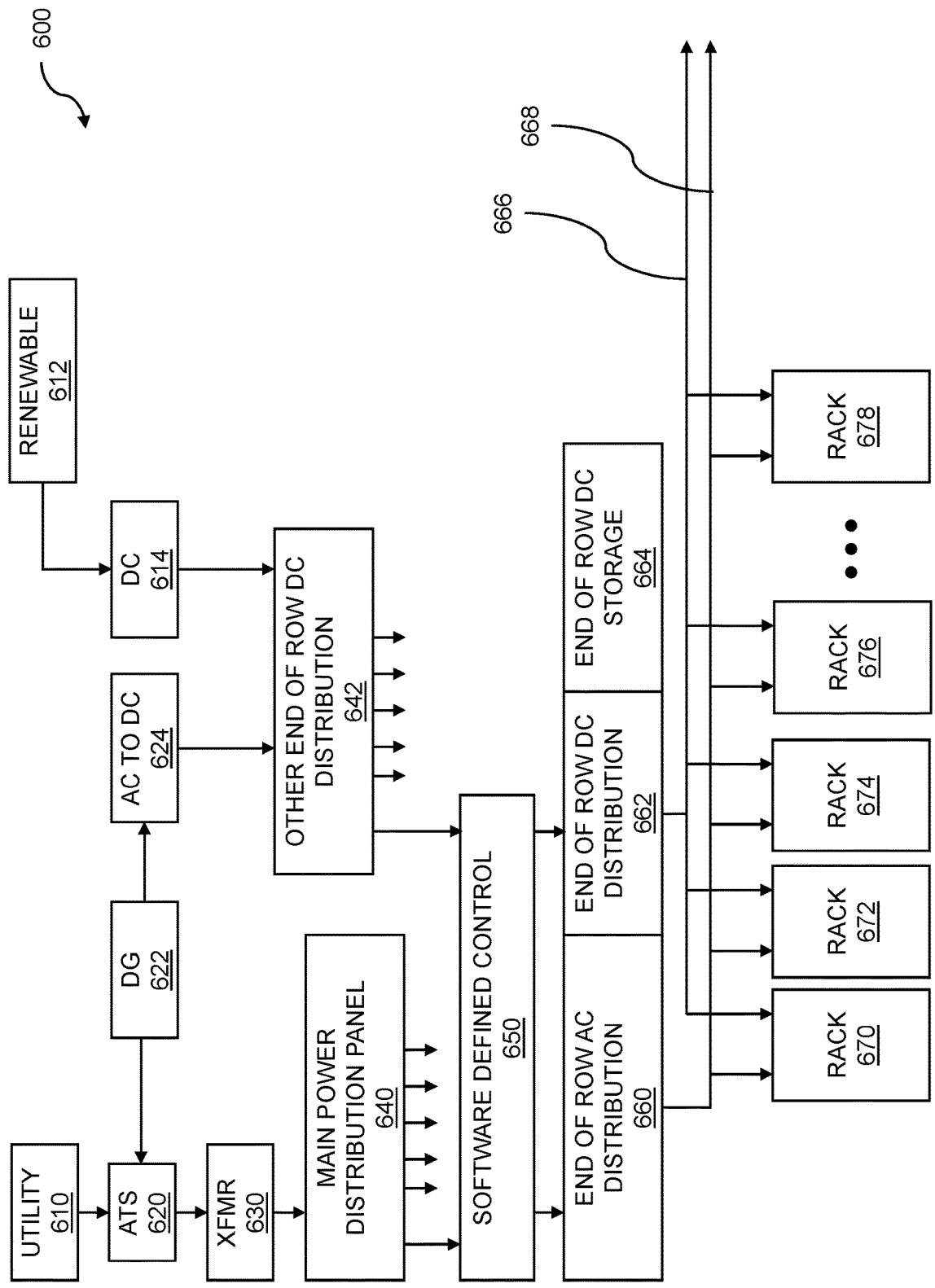
FIG. 6 is an example illustrating software-defined single-line power topology.

FIG. 6 is an example illustrating software-defined single-line power topology. Both alternating current power and direct current power can be obtained from a variety of sources and can be provided to a datacenter. AC power sources can include grid power, backup power, etc. DC power sources can include backup power from batteries, renewable power sources such as solar, hydro, or wind, and so on. The AC power can be connected to an AC power topology and the DC power can be connected DC power topology respectively within the datacenter. The AC power and the DC power can provide power to data racks. The data racks contain computing equipment, communications equipment, and other electrical equipment. The AC power and the DC power can be managed.

A single-line topology 600 is shown. Similar to the single-line topology discussed above, the single-line topology discussed here can include a single utility system such as a power feed from a single utility 610. The single-line topology described here differs from the one described previously in that additional components can be added to the single-line topology, or components which support software-defined power infrastructure can be substituted for previous components in the single-line technology. In embodiments, the software-defined power infrastructure controls the evaluating and the controlling in a dynamic manner. That is, the power infrastructure can be adapted on the fly to meet changing power requirements, where the changing power requirements can be based on equipment operation, job mix, seasonal impacts, and so on. The single-line topology may also include a second power source such as alternative power or backup power. The second power source can include renewable energy sources 612, where the renewable energy sources can generate AC power or DC power. In embodiments, the renewable energy DC 614 sources can include solar power, hydro power, or wind power. Other renewable sources can include tidal power, wave power, geothermal energy conversion, etc. In embodiments, an inverter can be used to convert from DC power to AC power. A backup power source can include a diesel-generator set 622. In embodiments, the DC power sources include a DC generator. An AC to DC converter 624 can be used to convert the AC power generated by the DG set into DC power. An automatic transfer switch (ATS) 620 can select between power sources. The selection of which power source to use can be based on any of the following: availability; cost; carbon footprint, etc., of utility power; power policies set for the datacenter, etc.

The single-line topology can include other power sources such as alternative power or backup power discussed. An automatic transfer switch (ATS) 620 can select between power sources based on whether utility power is available. Alternating current utility power or other power can be stepped down using a step-down transformer (XFMR) 630. Direct current power can result from rectifying backup or other power. In embodiments, the DC power sources can include a DC generator. The DC power sources include renewable energy DC sources. A variety of renewable energy sources can be used to provide the DC source. In embodiments, the renewable energy DC sources include solar power, hydro power, or wind power. Other renewable energy DC sources can include battery power, micro-hydro power, tidal power, wave-generated power, and so on. Circuit breakers (not shown) can protect electronic equipment located in a datacenter.

The output of the step-down transformer can be coupled to a main power distribution panel 640. The main power distribution panel can distribute AC power within a datacenter. DC power can be coupled to an end of row DC distribution panel 642. AC power and DC power can be fed through circuit breakers. The circuit breakers (not shown) can protect the various units of electrical and electronic equipment located within the datacenter. AC power from the main power distribution panel, and DC power from the end of row DC distribution panel can be coupled to a software-defined control 650. The software-defined control can be used to define both an AC power distribution topology and a DC power distribution topology. The software-defined control can be used to provision uninterruptable power supplies to a rack in a datacenter. The rack in the datacenter can include computing devices, communications devices, backup and retrieval devices, and so on. The AC power sources and the DC power sources can be evaluated for energizing their respective power distribution topologies. Based on power policies, software-defined rules, and so on, the AC power sources and the DC power sources can be connected to one or more UPSs. In embodiments, the software-defined power infrastructure is used to control the evaluating the one or more AC power sources, the evaluating the one or more DC power sources, the connecting the one or more AC power sources, and the connecting the one or more DC power sources. The software-defined control enables dynamic reconfiguration of the AC power topology and the DC power topology, power source selection and usage, etc.

Outputs from the software-defined control can be coupled to power distribution panels associated with rows of data racks, individual data racks, and so on, within the data center. AC power from the software-defined control can be coupled to one or more end of row AC power distribution 660 panels. DC power from the software-defined control can be coupled to one or more end of row DC distribution 662 panels. In embodiments, the power distribution center for the rack can include the AC power inputs, the DC power inputs, and a battery backup system. The battery backup system can include an uninterruptable power source. In embodiments, the battery backup system includes end of row DC storage 664. The end of row DC storage can be coupled to the end of row DC distribution, coupled to racks in the datacenter, and so on.

AC power from the end of row AC power distribution, DC power from the end of row DC power distribution, and the end of row DC power storage, can be routed to racks within the datacenter. The racks are placed in rows in the datacenter, where the rows can include twelve racks or another number of racks. Electronic equipment that requires AC power can be collocated in AC power racks, and electronic equipment that requires DC power can be collocated in DC power racks. In some embodiments, equipment that requires AC power and equipment that requires DC power are collocated within the same rack. The data racks, such as data racks 670, 672, 674, 676, and 678 can be coupled to the end of row AC distribution 660 using a distribution bus 668. The data racks can be coupled to the end of row DC distribution 662 using a distribution bus 666. The end of row DC storage 664 can be coupled to the end of row DC distribution 662 as shown, or can be coupled to one or more racks within the data center.

Figure 7:
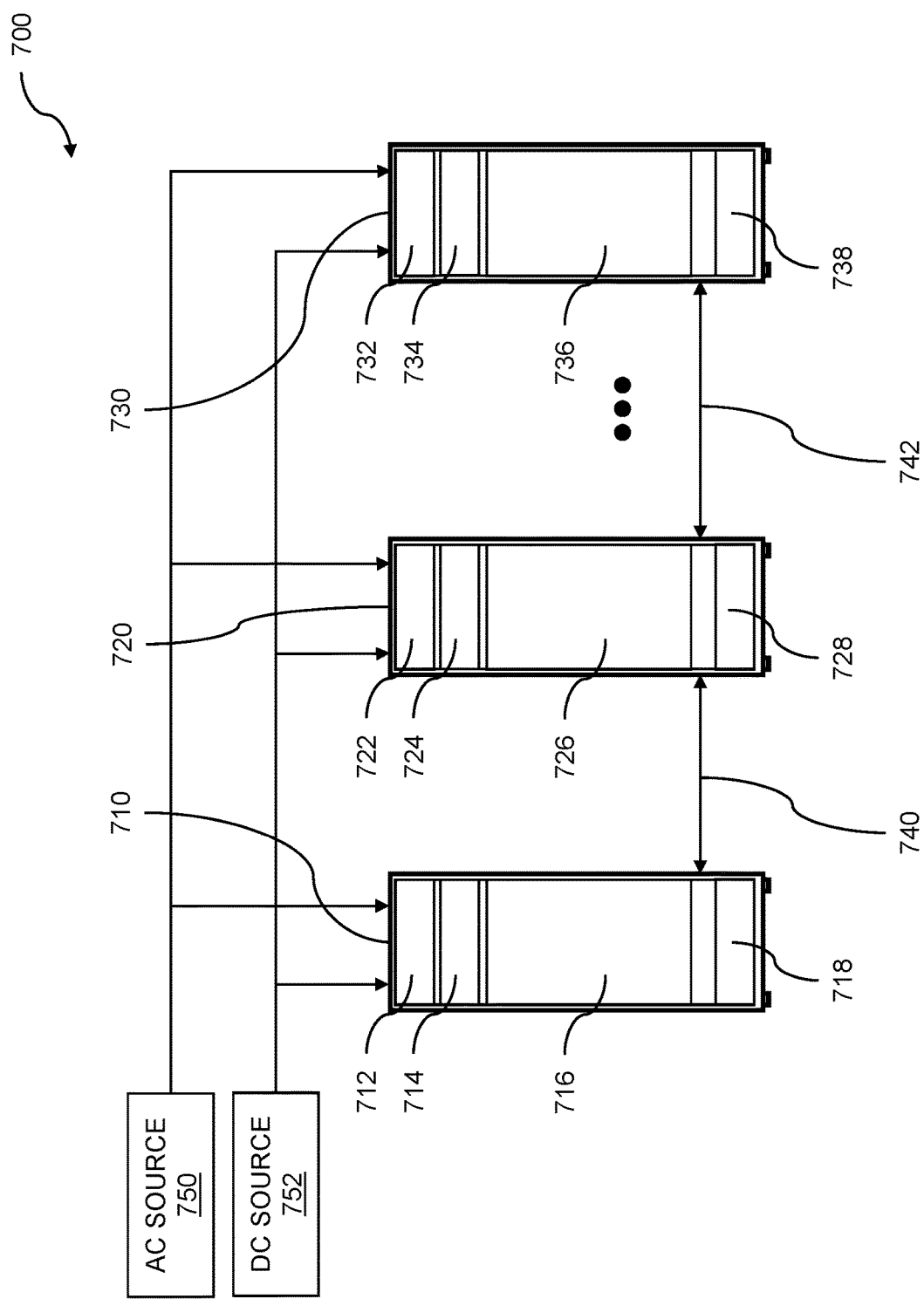
FIG. 7 illustrates data racks in a datacenter with AC and DC sources.

FIG. 7 illustrates data racks in a datacenter with AC and DC sources. Data racks contain a variety equipment for which power is controlled. The racks can include equipment for computation, communication, data storage and retrieval, heating ventilation and air conditioning (HVAC), backup power, and a variety of other electrical equipment. The power can be controlled based on a software-defined power infrastructure, where power sources and power distribution topologies can be configured dynamically. The power control is based on datacenter power management using AC and DC power sources.

A data center can include multiple data racks. Example 700 includes three data racks, indicated as rack 710, rack 720, and rack 730. While three data racks are shown in example 700, in practice, there can be more or fewer data racks. The data rack 710 includes a modified uninterruptable power supply 712, a server 714, a server 716, and a power supply 718. The power supply 718 can be used for AC-DC conversion and/or filtering of power to be used by the servers 714 and 716, as well as replenishment of the UPS 712. In embodiments, the UPS 712 includes an array of rechargeable batteries. In embodiments, the batteries include, but are not limited to, lead-acid, nickel metal hydride (NiMH), lithium ion (Li-ion), nickel cadmium (NiCd), and/or lithium ion polymer (Li-ion polymer) batteries. Similarly, the data rack 720 includes a modified UPS 722, a server 724, a server 726, and a power supply 728. Furthermore, the data rack 730 includes a modified UPS 732, a server 734, a server 736, and a power supply 738. The one or more UPSs can be provisioned to a rack of computing devices within the datacenter. A given UPS is capable of receiving one or more AC power sources 750 using the AC power distribution topology and the one or more DC power sources 752 using the DC power distribution topology.

The data racks are interconnected by communication links 740 and 742. The communication links can be part of a local area network (LAN). In embodiments, the communication links include a wired Ethernet, Gigabit Ethernet, or another suitable communication link. The communication links enable each data rack to send and/or broadcast current power usage, operating conditions, and/or estimated power requirements to other data racks and/or upstream controllers such as a cluster controller. Thus, in the example 700, a UPS can be coupled to each of the multiple data racks within the data center. In embodiments, the UPS includes multiple batteries spread across the multiple data racks.

The AC source 750 can be a component of an AC power distribution topology to a datacenter, and can be used to provide AC power to computing devices within the datacenter. The computing devices within the datacenter can include servers, blade servers, communications switches, backup data storage units, communications hardware, and other devices. The AC source can include grid power, diesel-generator power, backup power, renewable power, etc. The DC source 752 can be a component of a DC power distribution topology to the datacenter. The DC power distribution topology can be in addition to the AC power distribution topology within the datacenter. The DC power sources can include batteries and/or renewable energy DC sources. The renewable DC power sources can be co-located with the datacenter. In embodiments, the renewable energy DC sources can include solar power, hydro power, or wind power. The control of the AC power distribution topology and the DC power distribution topology can be based on using a software-defined power infrastructure. The software-defined power infrastructure can be based on power policies and can be dynamically updated in real-time.

Figure 8:
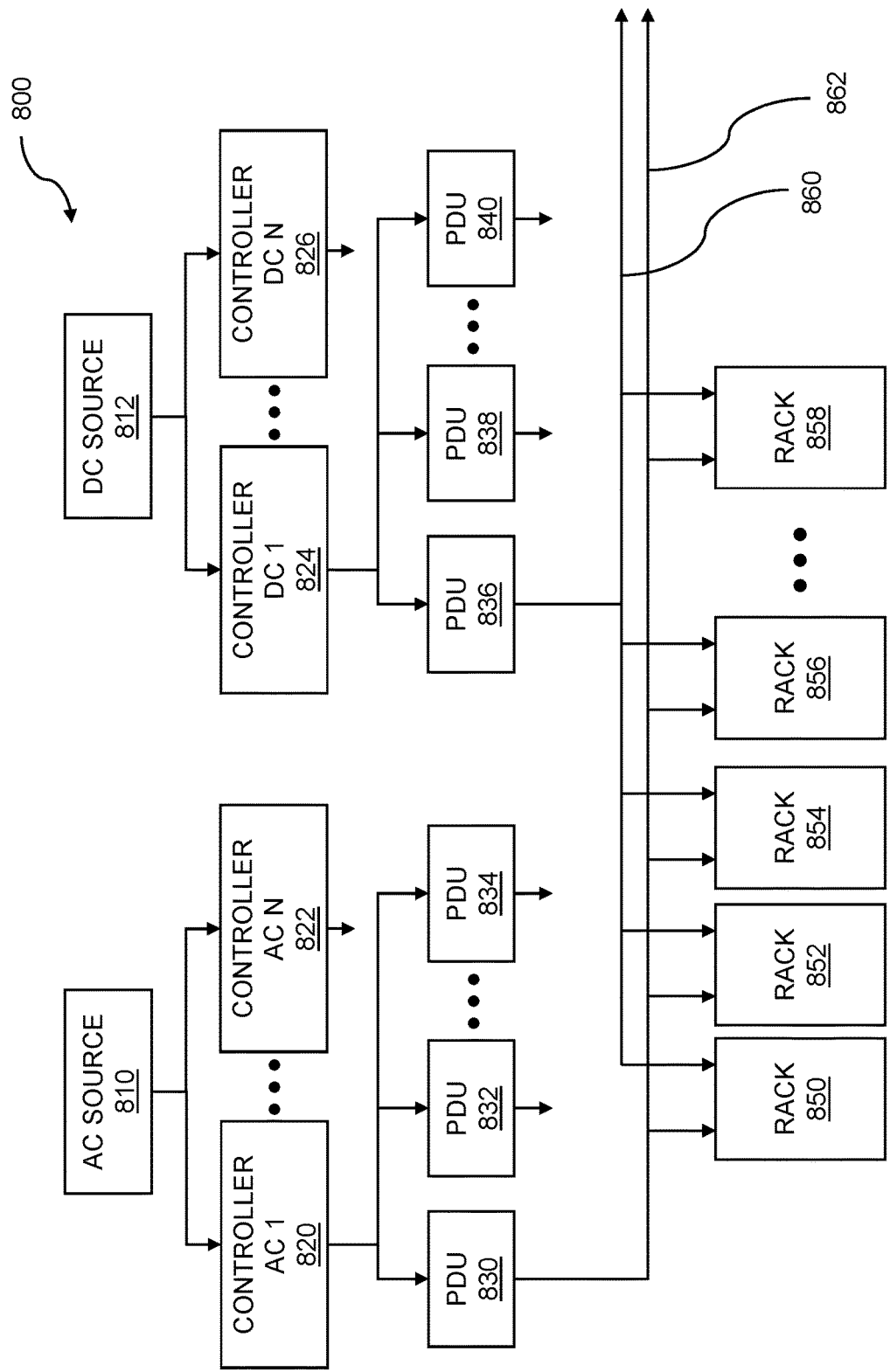
FIG. 8 illustrates distribution topology with power distribution units and power flow control.

FIG. 8 illustrates distribution topology with power distribution units and power flow control. An alternating current power distribution topology and a direct current power distribution topology can be used for distributing AC power and DC power respectively to various electronic and electrical devices installed within a datacenter. The power distribution topologies and the power flow control can be manipulated by using a software-defined power infrastructure. The software-define infrastructure can evaluate power sources for energizing the power distribution topologies, and can connect power sources to power loads. The power loads can include uninterruptable power supplies. The distribution topology supports datacenter power management using AC and DC power sources.

An AC source 810 can be connected to one or more AC controllers. The AC source can include grid power, backup power, and so on. The AC controllers can include controller AC 1 820, controller AC N 822, and so on. The AC controllers can include configurable controllers within a software-defined power infrastructure. The one or more AC controllers can be connected to one or more power distribution units (PDU). The PDUs can include PDU 830, PDU 832, PDU 834, and so on. The AC PDUs can be used to distribute the AC power to one or more data racks. A DC source 812 can be connected to one or more controllers. The DC source can include batteries, renewable energy sources, etc. The renewable energy DC sources can include solar power, hydro power, or wind power. Other renewable energy DC sources can include micro-hydro, tidal, wave-action, and the like. The DC controllers can include controller DC 1 824, controller DC N 826, and so on. The DC controllers can include reconfigurable controllers within the software-defined power infrastructure. The one or more DC controllers can be connected to one or more PDUs. The PDUs for DC power distribution can include PDU 836, PDU 838, PDU 840 etc. The DC PDUs can be used to distribute the DC power to one or more data racks.

The AC power distribution units can use an AC distribution bus 862 to distribute AC power to one or more data racks. In the example 800, data racks rack 850, rack 852, rack 854, rack 856, and rack 858 are shown. While five data racks are shown, other numbers of racks can receive power from the AC PDUs through the AC power distribution topology. The DC power distribution units can use a DC distribution bus 860 to distribute DC power to one or more data racks within the datacenter. The DC power can be distributed to the data racks rack 850 through rack 858. The data racks can receive power from the DC PDUs through the DC power distribution topology. In embodiments, racks may receive AC power, DC power, or both AC power and DC power.

Figure 9:
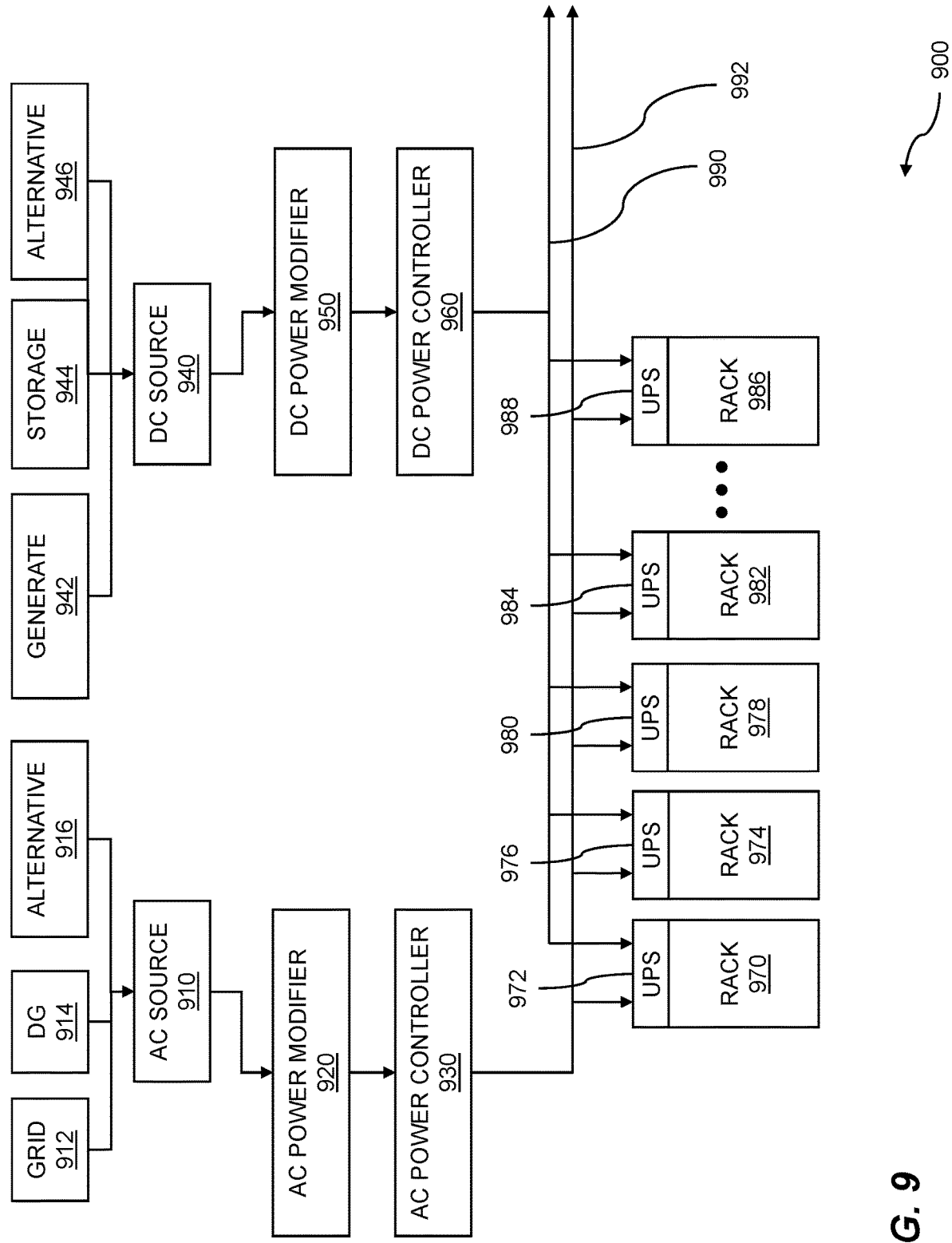
FIG. 9 shows modifying based on datacenter policy.

FIG. 9 shows modifying based on datacenter policy. The providing and provisioning of power to electronic and electrical equipment in a datacenter can be based on a datacenter policy. The one or more policies can include limits, such as power consumption limits, power source usage limits, etc., as well as carbon footprint policies, energy cost considerations, and so on. The one or more policies can include configurations of datacenter power distribution units that can be used when certain conditions are met. A power policy can allow peak shaving when surplus power exists, use of battery backup power when a power deficit exists, use of backup power when a grid power source goes offline or fails, etc. Power policies can control power switches, power topology configurations, and so on, based on a software-defined power infrastructure. Modifying based on datacenter policy supports datacenter power management using AC and DC sources.

Modifying based on datacenter policy is shown 900. An alternating current power source 910 can include power obtained from one or more grid power supplies 912, power from a diesel-generator set 914, power from alternative power sources 916, and so on. The alternative power sources can include locally generated power such as that obtained from windmills, micro-hydro dams, on-site solar arrays, etc. The power obtained from the renewable sources may need to be inverted to produce alternative sources of AC power from generated DC power. A direct current power source 940 can include power obtained from a DC generator 942, power from storage 944 such as backup batteries, power from alternative power sources 946, and so on. The alternative DC power sources can include renewable energy DC sources. In embodiments, the renewable energy DC sources can include solar power, hydro power, or wind power, among other renewable energy sources such as geothermal, tidal, wave, and so on.

Modifying based on datacenter policy can include an AC power modifier 920. The AC power modifier can be software controlled and can include a software-defined AC power infrastructure. Further embodiments include modifying load-side power usage within the rack based on power availability from the one or more AC power sources. The modifying load-side power usage can include turning off computational equipment, delaying computing jobs, reassigning tasks to servers that consume less power, and manipulating other equipment that can be mounted in racks within the datacenter. In embodiments, the rack of computing devices can include datacenter servers. The modifying load-side power usage can include carbon footprint considerations, power cost, and so on. Modifying based on datacenter policy can include a DC power modifier 950. Similar to the AC power modifier, the DC power modifier can modify load-side power usage within the rack, based on power availability from the one or more DC power sources. The AC power modifier and the DC power modifier can work in tandem or independently. Further embodiments include modifying load-side power usage within the rack, based on power cost from the one or more AC power sources and the one or more DC power sources. Power cost can be based on time of day such as daytime power rates versus nighttime power rates, seasonal considerations such as weather dependent power usage, etc. Other embodiments further include modifying the connecting the one or more DC power sources to the UPS, based on achieving a lower carbon footprint for the datacenter. The reduced carbon footprint for the datacenter can be achieved by using renewable energy sources, reducing the use of high power usage equipment, and so on.

In embodiments, the AC power distribution topology and the DC power distribution topology can include power distribution units and power flow control. An AC power controller 930 can be used to control AC power within the datacenter. The AC power controller can implement an AC power distribution topology. A DC power controller 960 can be used to control DC power within the datacenter. The DC power controller, like the AC power controller, can implement a DC power distribution topology. Recall that the AC power distribution topology and the DC power distribution topology can be configured based on software-defined power infrastructure. Embodiments include modifying the AC power topology or the DC power topology. The changing can be accomplished by supplying different code to the software-defined power infrastructure. The changing of the software-defined power infrastructure can include adding or removing power sources, adding or removing backup power sources, and so on. In embodiments, the changing can include adding one or more power caches to the DC power topology. The changing the software-defined power infrastructure can be based on environmental, supply, or other events. In embodiments, the connecting of a power source such as a backup power source is triggered by a power source failure.

The AC power and the DC power can be routed to data racks within the datacenter. The AC power can be distributed to data racks using an AC power distribution bus, power distribution topology 992, and so on. The DC power can be distributed to data racks within the datacenter using a DC power distribution bus, power distribution topology 990, etc. The AC power and the DC power can be routed to one or more UPSs, where one or more UPSs can be associated with a data rack. A given UPS can be provisioned to a rack of computing devices within the datacenter, where the UPS can be capable of receiving the one or more AC power sources using the AC power distribution topology and the one or more DC power sources using the DC power distribution topology. In the example 900, each data rack is shown with a UPS provisioned for it. The first rack 970 is provisioned with a UPS 972; the second rack 974 is provisioned with a UPS 976; the third rack 978 is provisioned with a UPS 980; the fourth rack 982 is provisioned with a UPS 984; and a fifth rack 986 is provisioned with a UPS 988. While five racks are shown, other numbers of racks can be provisioned with a UPS and connected to the AC power distribution topology and the DC power distribution topology.

Figure 10:
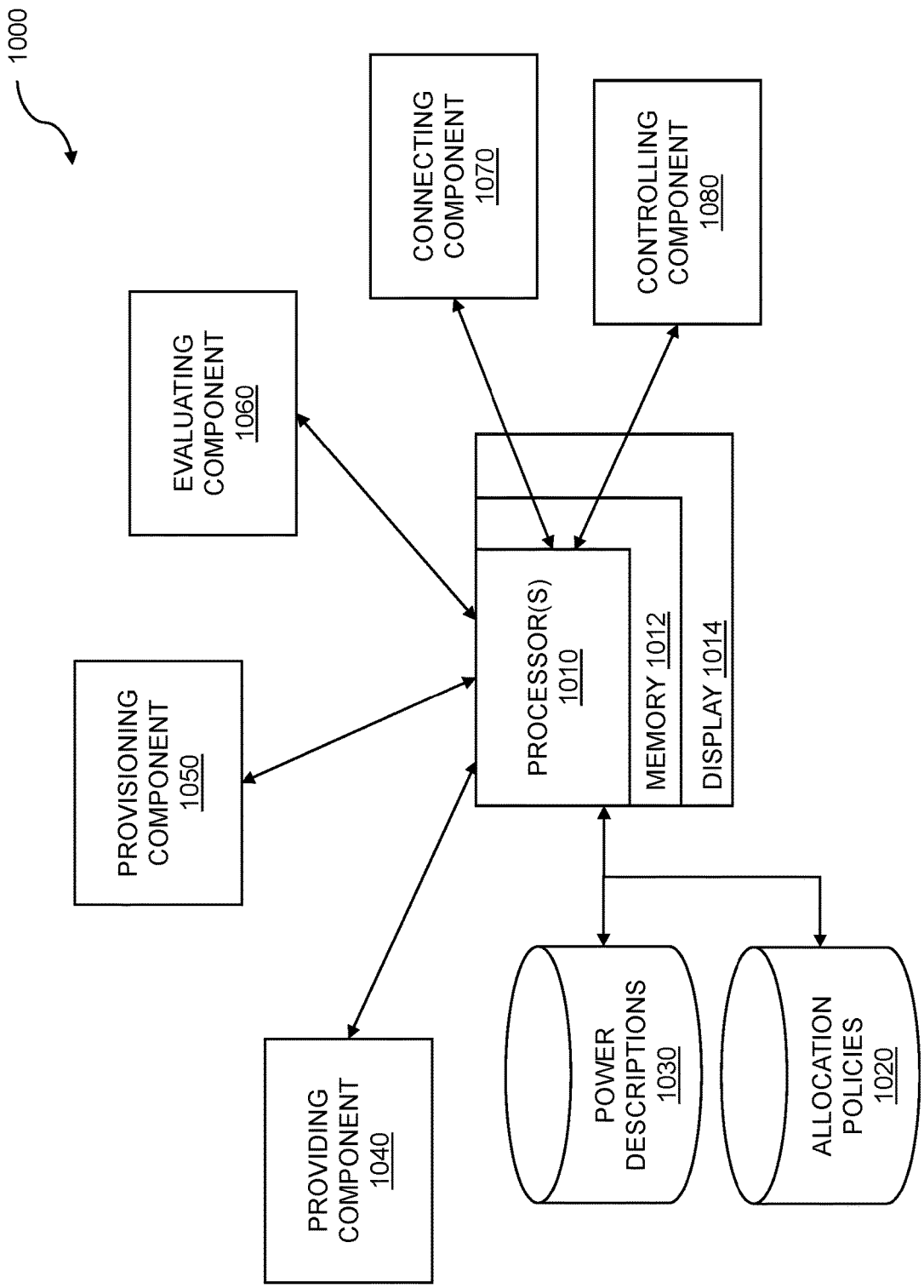
FIG. 10 shows a system diagram for redundant AC DC power distribution in a datacenter.

FIG. 10 shows a system diagram for redundant AC DC power management and distribution in a datacenter. AC power and DC power are provided, and an uninterruptable power supply is provisioned, for a data rack (IT rack) within the datacenter. The DC power sources and the AC power sources are evaluated for energizing the DC power distribution topology and the DC power distribution topology, respectively. DC power sources and AC power sources are connected to the UPS. The system 1000 can include one or more processors 1010 and a memory 1012 which stores instructions. The memory 1012 is coupled to the one or more processors 1010, wherein the one or more processors 1010 can execute instructions stored in the memory 1012. The memory 1012 can be used for system support and/or for storing the following: instructions; databases of power sources, power caches, and power loads; information pertaining to load requirements or redundancy requirements; power policies, and the like. Information about datacenter power management using AC and DC power sources can be shown on a display 1014 connected to the one or more processors 1010. The display can comprise a television monitor, a projector, a computer monitor (including a laptop screen, a tablet screen, a netbook screen, and the like), a smartphone display, a mobile device, or another electronic display.

The system 1000 includes allocation policies 1020. In embodiments, the allocation policies 1020 are stored in a networked database, such as a structured query language (SQL) database. The allocation policies 1020 can include limits, such as power consumption limits, power source usage limits, etc., as well as configurations of switches that can be used when certain conditions are met. For example, when power conditions allow peak shaving to take place, and surplus power exists, the power policies can identify switches and their configurations to allow replenishing of the power caches. The system 1000 further includes a repository of power descriptions 1030. The power descriptions 1030 can include, but are not limited to, power descriptions of power loads, power caches, power supplies, rack power profiles, batteries, buses, circuit breakers, fuses, switches, and the like. The system 1000 can include a providing component 1040. The providing component 1040 can be used to provide an AC power distribution topology within a datacenter to provide one or more AC power sources to computing devices within the datacenter. The providing component 1040 can provide a DC power distribution topology within the datacenter to provide one or more DC power sources to computing devices within the datacenter in addition to the AC power distribution topology. The providing the AC power sources can include grid power, locally generated power such as power from a diesel-generator set, renewable power, etc. The DC power sources can include solar power, battery power, and the like.

The system 1000 includes a provisioning component 1050. The provisioning component 1050 is configured to provision an uninterruptible power supply to a rack of computing devices within the datacenter, wherein the UPS is capable of receiving the one or more AC power sources using the AC power distribution topology and the one or more DC power sources using the DC power distribution topology. The system 1000 includes an evaluating component 1060. The evaluating component 1060 can evaluate the one or more DC power sources for energizing the DC power distribution topology. The evaluating can include available power, runtime, percentage utilization, etc. The system 1000 includes a connecting component 1070. The connecting component 1070 can connect the one or more DC power sources to the UPS which is provisioned to the rack of computing devices, based on the evaluating and a datacenter power requirement. In embodiments, the connecting component can further connect the one or more AC power sources to the UPS which is provisioned to the rack of computing devices. The connecting of the AC power sources, and the selection of which AC power sources to connect, can be based on the evaluating the one or more AC power sources, the evaluating the one or more DC power sources, and the datacenter power requirement. The system 1000 includes a controlling component 1080. The controlling component 1080 controls the evaluating the one or more AC power sources and the evaluating the one or more DC power sources. The controlling component can control the connecting the one or more AC power sources and the connecting the one or more DC power sources. The controlling component can control the evaluating and the connecting using a software-defined power infrastructure. The software-defined power infrastructure can include power policies. The software-defined power infrastructure can control the evaluating and the controlling in a dynamic manner. The dynamic control of the evaluating and the connecting can include reacting to power load changes, availability of power sources, usage history, mean time to failure (MTTF) computations, and the like. In embodiments, the controlling using the software-defined power structure further includes modifying load-side power usage within the rack, based on power availability from the one or more AC power sources and the one or more DC power sources.

Disclosed embodiments can include a computer program product embodied in a non-transitory computer readable medium for power control, the computer program product comprising code which causes one or more processors to perform operations of: providing an AC power distribution topology to a datacenter to provide one or more AC power sources to computing devices within the datacenter; providing a DC power distribution topology to the datacenter to provide one or more DC power sources to computing devices within the datacenter in addition to the AC power distribution topology; provisioning an uninterruptible power supply to a rack of computing devices within the datacenter, wherein the UPS is capable of receiving the one or more AC power sources using the AC power distribution topology and the one or more DC power sources using the DC power distribution topology; evaluating the one or more DC power sources for energizing the DC power distribution topology; and connecting the one or more DC power sources to the UPS which is provisioned to the rack of computing devices, based on the evaluating and a datacenter power requirement.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above-mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for power management comprising:
   providing an AC power distribution topology within a datacenter to provide one or more AC power sources to computing devices within the datacenter;
   providing a DC power distribution topology within the datacenter to provide one or more DC power sources to computing devices within the datacenter in addition to the AC power distribution topology;
   provisioning, using a software-defined power infrastructure, an uninterruptible power supply (UPS) to a rack of computing devices within the datacenter, wherein the UPS is capable of receiving the one or more AC power sources using the AC power distribution topology and the one or more DC power sources using the DC power distribution topology, and wherein the UPS includes multiple batteries spread across multiple data racks and uses the one or more DC power sources to load-share with the one or more AC power sources wherein load-sharing is enabled by a policy within the software-defined power infrastructure, wherein the policy directly determines a mix of AC power to be received from the one or more AC power sources using the AC power distribution topology and DC power to be received from the one or more DC power sources using the DC power distribution;
   directing the AC power sources to the UPS according to the mix;
   directing the DC power sources to the UPS according to the mix;
   evaluating the one or more DC power sources for energizing the DC power distribution topology; and
   connecting the one or more DC power sources to the UPS which is provisioned to the rack of computing devices, based on the evaluating and a datacenter power requirement.

2. The method of claim 1 further comprising evaluating the one or more AC power sources for energizing the AC power distribution topology.

3. The method of claim 2 further comprising connecting the one or more AC power sources to the UPS which is provisioned to the rack of computing devices, based on the evaluating the one or more AC power sources, the evaluating the one or more DC power sources, and the datacenter power requirement.

4. The method of claim 3 further comprising controlling the evaluating the one or more AC power sources, the evaluating the one or more DC power sources, the connecting the one or more AC power sources, and the connecting the one or more DC power sources, using the software-defined power infrastructure.

5. The method of claim 1 wherein determining a mix of AC power and DC power comprises selecting a ratio of AC power to DC power, wherein the ratio can vary continuously between the AC and DC power.

6. The method of claim 1 wherein the datacenter power requirement includes 1N redundancy, 2N redundancy, carbon footprint management, cost of energy, or source of energy.

7. The method of claim 1 wherein determining the mix of AC power and DC power comprises providing power capacity that would otherwise be held in reserve for redundancy.

8. The method of claim 1 wherein the DC power sources include renewable energy DC sources.

9. The method of claim 8 wherein the renewable energy DC sources include solar power, hydro power, or wind power.

10. The method of claim 1 wherein the rack of computing devices further comprises a power distribution center for the rack.

11. The method of claim 10 wherein the power distribution center for the rack includes AC power inputs, DC power inputs, and a battery backup system.

12. The method of claim 1, wherein the UPS is configured to use the DC power sources and the AC power sources in a grid-tied configuration, wherein when the UPS is operating on an AC feed from the AC power sources, DC peak shaving is performed, wherein when DC peak shaving occurs the AC power sources can be capped based on a peak shaving limit set by the software-defined power infrastructure.

13. The method of claim 12 wherein the additional rack of computing devices is provisioned with an additional UPS, wherein the additional UPS is capable of receiving the one or more AC power sources using the AC power distribution topology and the one or more DC power sources using the DC power distribution topology.

14. The method of claim 13 wherein the evaluating the one or more DC power sources is performed for both the rack and the additional rack.

15. The method of claim 14 further comprising coupling the one or more DC power sources to the additional UPS, based on the evaluating and the datacenter power requirement.

16. The method of claim 15 wherein the coupling the one or more DC power sources to the UPS and the additional UPS is dynamically updated based on real-time power needs of the rack and the additional rack.

17. The method of claim 1 further comprising changing the AC power distribution topology or the DC power distribution topology.

18. The method of claim 1 further comprising adding one or more power caches to the DC power distribution topology.

19. The method of claim 1 wherein the connecting is triggered by a power source failure.

20. The method of claim 1 wherein the rack of computing devices comprises datacenter servers.

21. The method of claim 1 wherein the AC power distribution topology and the DC power distribution topology include power distribution units and power flow control.

22. The method of claim 1 further comprising modifying load-side power usage within the rack, based on power availability from the one or more AC power sources and the one or more DC power sources.

23. The method of claim 1 further comprising modifying load-side power usage within the rack, based on power cost from the one or more AC power sources and the one or more DC power sources.

24. The method of claim 1 further comprising modifying the connecting the one or more DC power sources to the UPS, based on achieving a lower carbon footprint for the datacenter.

25. The method of claim 1 wherein the rack of computing devices is configured to receive and is provided with both AC power and DC power.

26. The method of claim 1 wherein the UPS is configured to isolate itself from the one or more AC power sources when the one or more AC power sources fail or are offline.

27. The method of claim 1 further comprising performing peak shaving when the UPS operates on the one or more AC power sources in order to limit AC input power based on a predetermined peak shaving limit.

28. The method of claim 1 wherein the uninterruptible power supply provides power to the rack based on a tuning of the one or more DC power sources and the one or more AC power sources wherein the tuning is accomplished using a policy within the software-defined power infrastructure.

29. The method of claim 1 wherein the uninterruptible power supply provides power to the rack based on a balancing of the one or more DC power sources and the one or more AC power sources using a policy within the software-defined power infrastructure.

30. The method of claim 1 further comprising dynamically reconfiguring the provisioning of the uninterruptible power supply to accomplish dynamic load-sharing.

31. A computer program product embodied in a non-transitory computer readable medium for power control, the computer program product comprising code which causes one or more processors to perform operations of:
   providing an AC power distribution topology to a datacenter to provide one or more AC power sources to computing devices within the datacenter;
   providing a DC power distribution topology to the datacenter to provide one or more DC power sources to computing devices within the datacenter in addition to the AC power distribution topology;
   provisioning, using a software-defined power infrastructure, an uninterruptible power supply (UPS) to a rack of computing devices within the datacenter, wherein the UPS is capable of receiving the one or more AC power sources using the AC power distribution topology and the one or more DC power sources using the DC power distribution topology, and wherein the UPS includes multiple batteries spread across multiple data racks and uses the one or more DC power sources to load-share with the one or more AC power sources wherein load-sharing is enabled by a policy within the software-defined power infrastructure, wherein the policy dictates a mix of AC power from the one or more AC power sources and DC power from the one or more DC power sources;
   identifying AC power sources according to the policy and the mix;
   identifying DC power sources according to the policy and the mix;
   directing power from the AC power sources and the DC power sources according to the policy and the mix;
   evaluating the one or more DC power sources for energizing the DC power distribution topology; and
   connecting the one or more DC power sources to the UPS which is provisioned to the rack of computing devices, based on the evaluating and a datacenter power requirement.

32. A computer system for power control comprising:
   a memory which stores instructions;
   one or more processors attached to the memory wherein the one or more processors, when executing the instructions which are stored, are configured to:
   provide an AC power distribution topology to a datacenter to provide one or more AC power sources to computing devices within the datacenter;
   provide a DC power distribution topology to the datacenter to provide one or more DC power sources to computing devices within the datacenter in addition to the AC power distribution topology;
   provision, using a software-defined power infrastructure, an uninterruptible power supply (UPS) to a rack of computing devices within the datacenter, wherein the UPS is capable of receiving the one or more AC power sources using the AC power distribution topology and the one or more DC power sources using the DC power distribution topology, and wherein the UPS includes multiple batteries spread across multiple data racks and uses the one or more DC power sources to load-share with the one or more AC power sources wherein load-sharing is enabled by a policy within the software-defined power infrastructure that defines a mix of AC power and DC power when at least one of the AC power sources is fully operational;
   establish AC power sources and DC power sources to provide power to the UPS according to the mix defined in the policy;
   evaluate the one or more DC power sources for energizing the DC power distribution topology; and
   connect the one or more DC power sources to the UPS which is provisioned to the rack of computing devices, based on the evaluating and a datacenter power requirement.

* * * * *